(12) United States Patent
Ohnuma et al.

(10) Patent No.: US 7,914,971 B2
(45) Date of Patent: Mar. 29, 2011

(54) LIGHT EXPOSURE MASK AND METHOD FOR MANUFACTURING SEMICONDUCTOR DEVICE USING THE SAME

(75) Inventors: Hideto Ohnuma, Kanagawa (JP); Masaharu Nagai, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 996 days.

(21) Appl. No.: 11/463,147

(22) Filed: Aug. 8, 2006

(65) Prior Publication Data

US 2007/0037070 A1  Feb. 15, 2007

(30) Foreign Application Priority Data

Aug. 12, 2005  (JP) ................... 2005-234791

(51) Int. Cl.
*H01L 21/00* (2006.01)
*H01L 21/84* (2006.01)
*G03F 1/00* (2006.01)

(52) U.S. Cl. .................. 430/311; 430/5; 438/163
(58) Field of Classification Search ............... 430/5, 311
See application file for complete search history.

(56) References Cited

U.S. PATENT DOCUMENTS

| | | | |
|---|---|---|---|
| 4,818,715 A | 4/1989 | Chao | |
| 5,371,025 A | 12/1994 | Sung | |
| 5,744,381 A | 4/1998 | Tabata et al. | |
| 6,071,652 A | 6/2000 | Feldman et al. | |
| 6,335,290 B1 | 1/2002 | Ishida | |
| 6,362,027 B1 * | 3/2002 | Yamazaki et al. | ............ 438/149 |
| 6,365,917 B1 | 4/2002 | Yamazaki | |
| 6,420,073 B1 | 7/2002 | Suleski et al. | |
| 6,515,336 B1 | 2/2003 | Suzawa et al. | |
| 6,534,425 B1 | 3/2003 | Karr et al. | |
| 6,534,826 B2 | 3/2003 | Yamazaki | |
| 6,541,294 B1 | 4/2003 | Yamazaki et al. | |
| 6,613,620 B2 | 9/2003 | Fujimoto et al. | |

(Continued)

FOREIGN PATENT DOCUMENTS

JP  10032327 A  2/1998

(Continued)

OTHER PUBLICATIONS

Kim et al. A Novel Four-Mask-Count Process Architecture for TFT-LCDS SID Digest 00 : SID International Symposium Digest of Technical Papers 2000 pp. 1006-1009.

*Primary Examiner* — Stephen Rosasco
*Assistant Examiner* — Jonathan Jelsma
(74) *Attorney, Agent, or Firm* — Fish & Richardson P.C.

(57) ABSTRACT

The present invention provides a light exposure mask which can form a photoresist layer in a semi-transmissive portion with uniform thickness, and a method for manufacturing a semiconductor device in which the number of photolithography steps (the number of masks) necessary for manufacturing a TFT substrate is reduced by using the light exposure mask. A light exposure mask is used, which includes a transmissive portion, a light shielding portion, and a semi-transmissive portion having a light intensity reduction function where lines and spaces are repeatedly formed, wherein the sum of a line width L of a light shielding material and a space width S between light shielding materials in the semi-transmissive portion satisfies a conditional expression $(2n/3) \times m \leq L+S \leq (6n/5) \times m$ when a resolution of a light exposure apparatus is represented by n and a projection magnification is represented by $1/m$ ($m \geq 1$).

12 Claims, 14 Drawing Sheets

U.S. PATENT DOCUMENTS

| | | |
|---|---|---|
| 6,638,667 B2 | 10/2003 | Suleski et al. |
| 6,646,287 B1 | 11/2003 | Ono et al. |
| 6,660,462 B1 | 12/2003 | Fukuda |
| 6,664,145 B1 | 12/2003 | Yamazaki et al. |
| 6,670,284 B2 | 12/2003 | Yin |
| 6,707,068 B2 | 3/2004 | Fujimoto et al. |
| 6,773,996 B2 | 8/2004 | Suzawa et al. |
| 6,828,586 B2 | 12/2004 | Eguchi et al. |
| 6,872,604 B2 | 3/2005 | Yamazaki et al. |
| 6,909,114 B1 | 6/2005 | Yamazaki |
| 7,316,946 B2 | 1/2008 | Ohnuma et al. |
| 2001/0019127 A1 | 9/2001 | Ishida |
| 2002/0025591 A1* | 2/2002 | Ohnuma et al. ............ 438/30 |
| 2002/0146627 A1 | 10/2002 | Suleski et al. |
| 2002/0160547 A1 | 10/2002 | Shih |
| 2005/0140877 A1* | 6/2005 | Jeoung et al. ............ 349/114 |
| 2006/0014335 A1 | 1/2006 | Ohnuma et al. |
| 2006/0275710 A1 | 12/2006 | Yamazaki et al. |
| 2006/0278875 A1 | 12/2006 | Ohnuma et al. |
| 2007/0001225 A1 | 1/2007 | Ohnuma et al. |
| 2007/0023790 A1 | 2/2007 | Ohnuma et al. |
| 2007/0218604 A1 | 9/2007 | Ohnuma et al. |
| 2008/0119024 A1 | 5/2008 | Ohnuma et al. |

FOREIGN PATENT DOCUMENTS

| | | |
|---|---|---|
| JP | 2002-099070 | 4/2002 |
| JP | 2002-151523 | 5/2002 |
| JP | 2002-268200 | 9/2002 |

* cited by examiner first TFT portion 520 | second TFT portion 530 | wiring portion 540

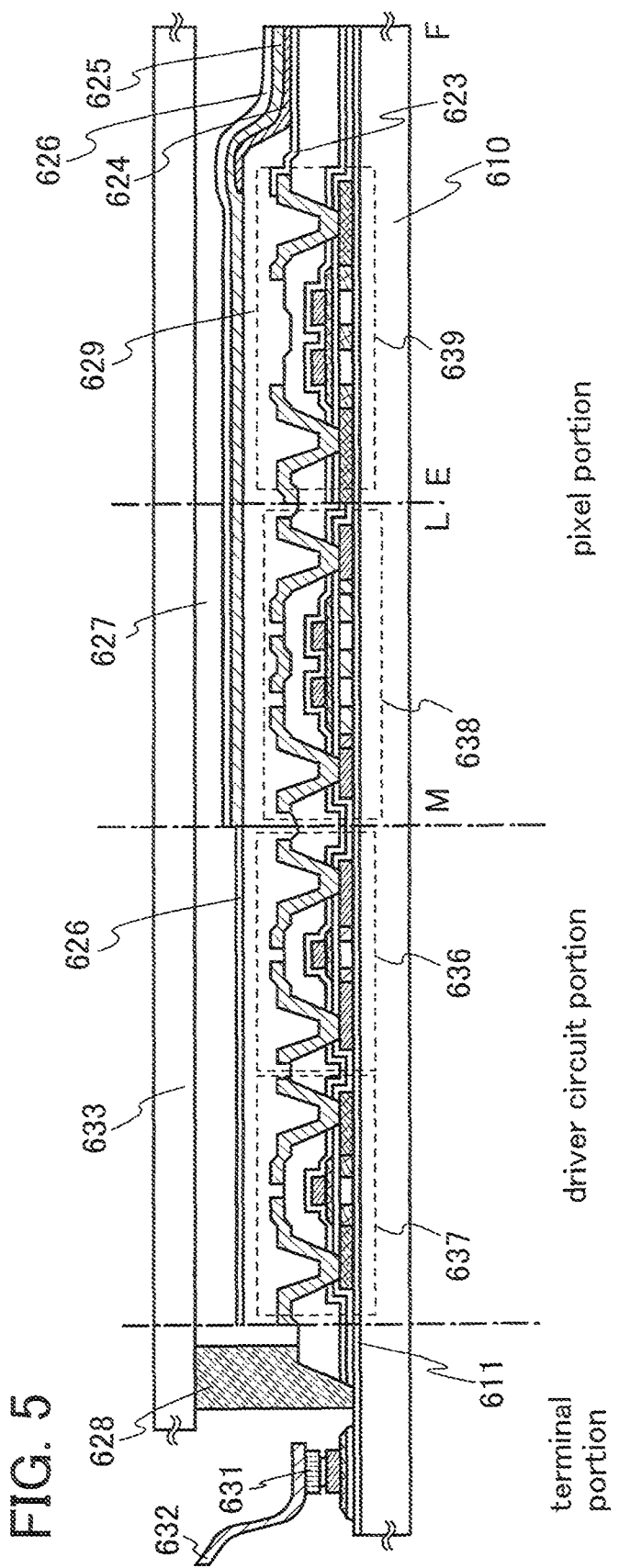

wiring portion and contact portion 740 | first TFT portion 730 | second TFT portion 720

LIGHT EXPOSURE MASK AND METHOD FOR MANUFACTURING SEMICONDUCTOR DEVICE USING THE SAME

BACKGROUND OF THE INVENTION

1. Field of the Invention

The present invention relates to a light exposure mask used in a photolithography step, and a method for manufacturing a semiconductor device which has a circuit including a thin film transistor (hereinafter referred to as a TFT) by using the light exposure mask. For example, the present invention relates to a method for manufacturing an electronic device which is mounted as a component with an electro-optical device typified by a liquid crystal display panel or a light emitting display device including an organic light emitting element.

Note that the term "semiconductor device" in this specification refers to a device in general that can operate by utilizing semiconductor characteristics, and an electro-optical device, a semiconductor circuit, and an electronic device are all included in the semiconductor device.

2. Description of the Related Art

In order to form a mask made of a photoresist in manufacturing a semiconductor device provided with a thin film transistor (hereinafter referred to as a TFT), many steps are required before and after the formation. The required steps are, for example, substrate cleaning, resist material application, pre-bake, light exposure, development, post-bake, and the like.

The mask made of a photoresist needs to be removed after etching treatment or doping treatment, and the removal also requires many steps. The required steps are, for example, ashing treatment using a gas selected from $O_2$, $H_2O$, $CF_4$, and the like, peeling treatment using various kinds of chemicals, peeling treatment combining the ashing treatment and treatment using chemicals, and the like. In this case, the peeling treatment using chemicals requires steps such as chemical treatment, rinse treatment with pure water, and substrate drying. Therefore, the use of the mask made of a photoresist causes a problem of increasing the number of steps for manufacturing a semiconductor device. A reduction in the number of photolithography steps, that is, a reduction in the number of masks used in photolithography steps is needed for reduction in processing time and cost.

As a method for reducing the number of masks, a light exposure method is proposed which uses a light transmitting substrate that can transmit exposure light and a light exposure mask including a light shielding portion formed of chromium or the like over the light transmitting substrate and a semi-transmissive portion having a light intensity reduction function where lines of a light shielding material and spaces are repeatedly formed with respective predetermined line widths. A light exposure mask including a semi-transmissive portion formed by lines and spaces is also referred to as a gray-tone light exposure mask, and light exposure using this light exposure mask is also referred to as gray-tone light exposure. By using this light exposure mask, one photoresist layer can be developed to have at least two different thicknesses. Then, a layer to be etched is etched while ashing this photoresist, which enables two layers to be etched to be formed into different patterns through a single photolithography step. This can eliminate one photolithography step, that is, one mask (for example, see Reference 1: Japanese Patent Laid-Open No. 2002-151523).

In the case of using a light exposure apparatus with a projection magnification of 1:1, for example, this light exposure mask including a semi-transmissive portion is formed so that the width of each of the lines and the spaces is smaller than the resolution (resolution limit) of the light exposure apparatus. Accordingly, the lines and spaces are not resolved but blurred over the substrate; therefore, the amount of exposure light transmitted through the semi-transmissive portion over the substrate is almost homogenized over almost the entire semi-transmissive portion. As a result, the photoresist layer can be formed with small thickness in the semi-transmissive portion.

However, in the case of using a light exposure apparatus with high resolution, there is a case where the photoresist layer cannot be formed with small thickness even when each of lines and spaces is formed smaller than the resolution or cannot be formed with uniform thickness even when the photoresist layer can be formed with small thickness. FIGS. 13A and 13B show an example thereof. FIG. 13A shows a schematic cross-sectional view of a light exposure mask, and FIG. 13B shows a cross-sectional photograph of a photoresist layer obtained by light exposure and development using the light exposure mask. The position of the light exposure mask in FIG. 13A and the position of the photoresist layer in the cross-sectional photograph of FIG. 13B practically correspond to each other. A light exposure apparatus with a projection magnification of 1:1 and a resolution of 1.5 μm is used. Even when using a light exposure mask of which each of lines and spaces is smaller than the resolution as shown in FIG. 13A, there is a case where a photoresist layer having a region with small and uniform thickness cannot be formed. In a region of the light exposure mask of FIG. 13A where each line has a width of 1.0 μm and each space has a width of 0.5 μm, the photoresist layer is not formed with small thickness but with large thickness, almost the same thickness as that of a light shielding portion. Furthermore, when a semi-transmissive portion is provided on a side of a light shielding portion with both a line width and a space width of 0.5 μm, there is a case where the photoresist layer cannot be formed with small thickness and is formed into a tapered shape in which a thickness is decreased from a light shielding portion toward a transmissive portion.

SUMMARY OF THE INVENTION

The present invention is directed at improving productivity or reducing cost of a semiconductor device including a TFT, and provides a light exposure mask with which a photoresist layer having a region with small and uniform thickness can be formed, and a method for manufacturing a semiconductor device in which the number of photolithography steps (the number of masks) necessary for manufacturing a TFT substrate is reduced by using the light exposure mask.

In order to achieve the above object, one feature of the present invention is to use a light exposure mask including a transmissive portion, a light shielding portion, and a semi-transmissive portion having a light intensity reduction function where lines and spaces are repeatedly formed, wherein the relation between the sum of a line width L of a light shielding material and a space width S between light shielding materials in the semi-transmissive portion, n, and m satisfies a conditional expression $(n/3) \times m \leq L + S \leq (3n/2) \times m$ when a resolution of a light exposure apparatus is represented by n and a projection magnification is represented by $1/m$ ($m \geq 1$).

Preferably, a feature is to use a light exposure mask in which the sum of L and S, n, and m satisfies a conditional expression $(2n/3) \times m \leq L + S \leq (6n/5) \times m$.

It is preferable to use a light exposure mask in which the relation between n, m, and L satisfies $L < (2n/3) \times m$. For example, the line width L of the semi-transmissive portion preferably satisfies L<1.0 μm when the light exposure apparatus has a resolution n of 1.5 μm and a projection magnification 1/m of 1:1 (m=1).

A light exposure mask is also referred to as a photomask or a reticle. A projection-type light exposure apparatus can be used as the light exposure apparatus. A light exposure apparatus with a projection magnification of 1:1 or a reduced-projection light exposure apparatus with a projection magnification (reduction magnification) of 1/m can be used.

The resolution n indicates the size of resolution limit on a surface to be exposed to light whereas the line width L and the space width S indicate the sizes on the light exposure mask. Therefore, the resolution n, L, and S can be simply compared with each other to determine the magnitude relation therebetween when using a light exposure apparatus with a projection magnification of 1:1. However, the resolution n, L, and S cannot be simply compared with each other to determine the magnitude relation therebetween when using a reduced-projection light exposure apparatus with a projection magnification (reduction magnification) of 1/m. In this case, the resolution n, L, and S can be compared with each other to determine the magnification relation therebetween by multiplying the resolution n by a reciprocal m of the projection magnification (reduced magnification) 1/m even when using the reduced-projection light exposure apparatus. It is for this reason that the resolution n is multiplied by the reciprocal m (m≧1) of the projection magnification (reduction magnification) in the above conditional expression. When using the light exposure apparatus with a projection magnification of 1:1, the reciprocal m of the projection magnification 1/m is 1.

Another feature of the present invention is to form a resist pattern having a thick first region and a second region thinner than the first region on a side of the first region by using the above-described light exposure mask, and to selectively etch a film to be etched by using the resist pattern.

The semi-transmissive portion of the above-described light exposure mask can be provided with lines and spaces which are repeatedly formed in stripes (in slits). Alternatively, the semi-transmissive portion may be provided with rectangular patterns made of a light shielding material, which are periodically arranged in a grid or geometrically. Furthermore, the semi-transmissive portion can be provided with other patterns as long as the patterns have uniform width. The lines included in the semi-transmissive portion are formed of a light shielding material and can be formed using the same light shielding material as the light shielding portion.

In the light exposure mask satisfying the above relation, it is particularly effective to arrange the semi-transparent portion on a side of the light shielding portion.

One feature of a method for manufacturing a semiconductor device of the present invention is to include the steps of forming an insulating film over a semiconductor layer; forming a conductive film over the insulating film; forming over the conductive film a resist pattern having a thick first region and a second region thinner than the first region on a side of the first region by using a light exposure mask including a semi-transmissive portion; forming a gate electrode having a thick first region and a second region thinner than the first region on a side of the first region by etching the conductive film with the use of the resist pattern; and injecting an impurity element into the semiconductor layer with the use of the gate electrode as a mask to form a source region and a drain region outside the gate electrode, and injecting the impurity element into the semiconductor layer through the second region of the gate electrode to form a first impurity region and a second impurity region in a region overlapped with the second region of the gate electrode, wherein the resist pattern is formed by using the light exposure mask in which the relation between the sum of a line width L of a light shielding material and a space width S between light shielding materials in the semi-transmissive portion, n, and m satisfies a conditional expression $(n/3) \times m \leqq L+S \leqq (3n/2) \times m$ when a resolution of a light exposure apparatus is represented by n and a projection magnification is represented by 1/m (m≧1).

Preferably, a feature is to use a light exposure mask in which the relation between the sum of L and S, n, and m satisfies a conditional expression $(2n/3) \times m \leqq L+S \leqq (6n/5) \times m$.

It is preferable to use a light exposure mask in which the relation between n, m, and L satisfies $L < (2n/3) \times m$. For example, the line width L of the semi-transmissive portion preferably satisfies L<1.0 μm when a light exposure apparatus has a resolution n of 1.5 μm and a projection magnification 1/m of 1:1 (m=1).

One feature of the first and second impurity regions is to contain an impurity element which imparts n-type or p-type conductivity at a lower concentration than that of the source region and the drain region.

FIGS. 12A and 12B show an example of performing light exposure and development by using a light exposure mask which practically satisfies the above relation. FIG. 12A shows a schematic cross-sectional view of a light exposure mask, and FIG. 12B shows a cross-sectional photograph of a photoresist layer obtained by light exposure and development using the light exposure mask. The position of the light exposure mask in FIG. 12A and the position of the photoresist layer in the cross-sectional photograph of FIG. 12B practically correspond to each other. A light exposure apparatus with a projection magnification of 1:1 and a resolution of 1.5 μm is used. In the light exposure mask of FIG. 12A, each line has a width of 0.5 μm and each space has a width of 1.0 μm, and the lines and the spaces satisfy the above relation. When light exposure and development are performed by using this light exposure mask, a photoresist layer having a region with small and almost uniform thickness can be formed as shown in FIG. 12B.

By performing light exposure using a light exposure mask including a semi-transmissive portion which satisfies the above relation, the amount of exposure light transmitted through the semi-transmissive portion over a surface to be exposed to light is almost homogenized in the semi-transmissive portion. Thus, the photoresist layer in the semi-transmissive portion can be formed with small and uniform thickness. A layer to be etched can be etched by using this portion with small thickness of the photoresist layer. In the portion with small thickness of the photoresist layer, the layer to be etched can be etched to have smaller thickness than that of a portion with large thickness. In the portion with small thickness of the photoresist layer, a pattern of the layer to be etched can be formed in a different shape from that of the portion with large thickness. Then, by using this resist pattern, a gate electrode, other electrodes, a wire, and the like can be formed in a desired pattern with high accuracy. When a gate electrode having a thick first region and a second region thinner than the first region on a side of the first region is formed by using the light exposure mask, a low-concentration impurity region overlapped with the gate electrode ($L_{ov}$ region) can be formed in a self-aligned manner on either or both sides of a channel formation region by using the gate electrode as a mask at the time of ion doping.

By manufacturing a semiconductor device which includes a TFT (a GOLD structure: Gate-drain overlapped LDD) having a low-concentration impurity region overlapped with a gate electrode ($L_{ov}$ region) in a self-aligned manner, the number of masks can be reduced, and precise alignment in manufacturing a GOLD structure becomes unnecessary. Accordingly, many steps such as substrate cleaning, resist material application, pre-bake, light exposure, development, and post-bake can be eliminated, and processing time can be shortened. In addition, manufacturing cost can be reduced and product yield can be improved.

By using a light exposure mask which includes a semi-transmissive portion satisfying the above relation, a $L_{ov}$ region can be formed in a self-aligned manner. Further, there is no limitation on length (length in a channel length direction), and the length can be sufficiently secured. Moreover, $L_{ov}$ regions on both sides of a channel formation region can be formed with different lengths.

BRIEF DESCRIPTION OF DRAWINGS

FIG. 5 is a cross-sectional view of a light emitting device (Embodiment Mode 5).

DETAILED DESCRIPTION OF THE INVENTION

Embodiment modes of the present invention are hereinafter explained in detail with reference to the accompanying drawings. Note that the present invention is not limited to the embodiment modes described below, and various changes are permitted unless they deviate from the spirit.

Embodiment Mode 1

In this embodiment mode, a light exposure mask including a semi-transmissive portion formed by lines and spaces, or rectangular patterns and spaces is explained with reference to FIGS. 1A to 1D.

Figure 1A:
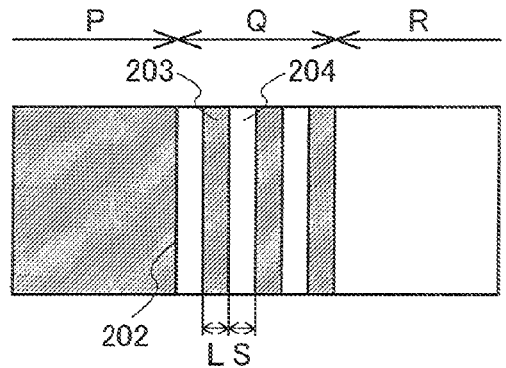
FIGS. 1A to 1D are diagrams showing top views of exposure masks and light intensity distribution (Embodiment Mode 1).
Figure 1B:
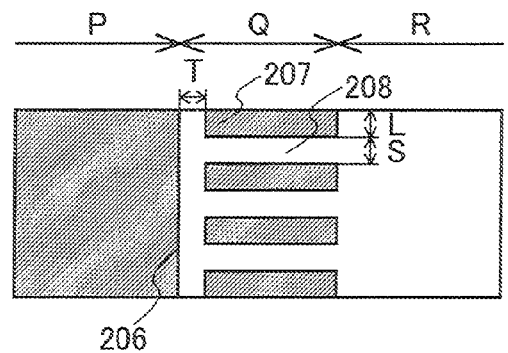
Figure 1C:
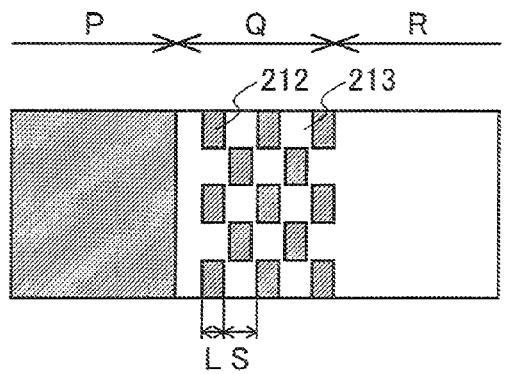
Figure 1D:
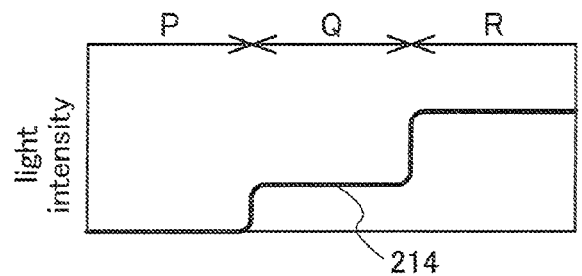

Specific examples of top views of light exposure masks are shown in FIGS. 1A to 1C. In addition, an example of light intensity distribution when using a light exposure mask is shown in FIG. 1D. Each of the light exposure masks shown in FIGS. 1A to 1C includes a light shielding portion P, a semi-transmissive portion Q, and a transmissive portion R. In the semi-transmissive portion Q of the light exposure mask shown in FIG. 1A, lines 203 and spaces 204 are repeatedly provided in stripes (in slits), and the lines 203 and the spaces 204 are arranged parallel to an edge 202 of the light shielding portion P. In this semi-transmissive portion, a width of each line 203 made of a light shielding material is L and a width of each space between light shielding materials is S. A light exposure mask is used in which the relation between the sum of L and S, a resolution n of a light exposure apparatus, and a projection magnification 1/m ($m \geq 1$) satisfies a conditional expression $(n/3) \times m \leq L+S \leq (3n/2) \times m$. Preferably, a light exposure mask is used in which the relation between the sum of L and S, n, and m satisfies a conditional expression $(2n/3) \times m \leq L+S \leq (6n/5) \times m$. The lines 203 are made of a light shielding material and can be formed using the same light shielding material as the light shielding portion P. The lines 203 are formed in a rectangular shape, but the shape is not limited thereto. It is acceptable as long as the lines have uniform width. For example, each line may have a shape with round corners.

By using a light exposure mask satisfying the above relation, the amount of exposure light transmitted through the semi-transmissive portion on a surface to be exposed to light is almost homogenized in the semi-transmissive portion, and a photoresist layer of a light exposure portion in the semi-transmissive portion can be formed with small and uniform thickness, thereby obtaining a desired pattern with high accuracy.

FIG. 1B shows another example. In a semi-transmissive portion Q of a light exposure mask, lines 207 and spaces 208 are provided in stripes, and the lines 207 and the spaces 208 are arranged perpendicular to an edge 206 of a light shielding portion P. A light exposure mask is used in which the relation between a width L of each line 207 and a width S of each space 208 of the semi-transmissive portion, a resolution n of a light exposure apparatus, and a projection magnification 1/m ($m \geq 1$) satisfies the above condition similarly to FIG. 1A. In other words, a light exposure mask is used in which the relation between the sum of L and S, a resolution n of a light exposure apparatus, and a projection magnification 1/m ($m \geq 1$) satisfies a conditional expression $(n/3) \times m \leq L+S \leq (3n/2) \times m$. Preferably, a light exposure mask is used in which the relation between the sum of L and S, n, and m satisfies a conditional expression $(2n/3) \times m \leq L+S \leq (6n/5) \times m$. The edge 206 of the light shielding portion P and edges of the lines 207 of the semi-transmissive portion Q may be in contact with each other, or may be arranged with a distance T as shown. It is acceptable as long as the distance T is shorter than ($n \times m$) that is the resolution n of the light exposure apparatus multiplied by a reciprocal m of the projection magnification. The light exposure mask of FIG. 1B may be similar to that of FIG. 1A in material, shape, and the like other than arrangement of lines and spaces.

The lines and spaces of the semi-transmissive portion Q may be in either direction of FIG. 1A or 1B. In addition, a combination of FIGS. 1A and 1B can also be used. Further, the lines and spaces of the semi-transmissive portion Q may be arranged in an intermediate direction between FIGS. 1A and 1B, that is, obliquely with respect to the edge of the light-shielding portion P. Also in this case, the light exposure mask may be similar to that of FIG. 1A in material, shape, and the like other than arrangement of lines and spaces.

The semi-transmissive portion Q may be provided with lines and spaces that are arranged in stripes as shown in FIG. 1A or 1B, or may be provided with another pattern. For example, the semi-transmissive portion Q may be provided with rectangular patterns 212 made of a light shielding material that are periodically arranged in a grid or geometrically as shown in FIG. 1C. In FIG. 1C, a width L of each rectangular pattern 212 in a short-side direction corresponds to the width L of each line. In addition, a width S of each space 213 in the short-side direction corresponds to the width S of each space. A light exposure mask is used in which the relation between the sum of the width L of each rectangular pattern 212 and the width S of each space 213, a resolution n of a light exposure apparatus, and a projection magnification 1/m (m≧1) satisfies the above condition similarly to FIG. 1A. In other words, a light exposure mask is used in which the sum of L and S, a resolution n of a light exposure apparatus, and a projection magnification 1/m (m≧1) satisfies a conditional expression (n/3)×m≦L+S≦(3n/2)×m. Preferably, a light exposure mask is used in which the relation between the sum of L and S, n, and m satisfies a conditional expression (2n/3)×m≦L+S≦(6n/5)×m. The rectangular patterns 212 are made of a light shielding material and can be formed using the same light shielding material as the light shielding portion P.

The lines and spaces (or rectangular patterns and spaces) of the semi-transmissive portion may be arranged periodically as shown in FIGS. 1A to 1C or non-periodically. When arranged non-periodically, it is acceptable as long as a line and a space (or a rectangular pattern and a space) adjacent to each other satisfies the above condition. By adjusting a width of each of lines and spaces (or rectangular patterns and spaces) within the range satisfying the above condition, the practical amount of exposure light can be changed and the thickness of a light-exposed resist after development can be adjusted.

Note that it is difficult to employ a negative-type resist as the resist used in this photolithography step; therefore, a pattern of the light exposure mask is premised on a positive-type resist. A projection-type light exposure apparatus can be used as the light exposure apparatus. A light exposure apparatus with a projection magnification of 1:1 or a reduced-projection light exposure apparatus with a projection magnification of 1/m can be used.

When the light exposure mask shown in each of FIGS. 1A to 1C is irradiated with exposure light, light intensity in the light shielding portion P is approximately zero, and light intensity in the transmissive portion R is approximately 100%. On the other hand, light intensity in the semi-transmissive portion can be adjusted in the range of 10% to 70%, and an example of its typical light intensity distribution is shown as light intensity distribution 214 in FIG. 1D. The light intensity in the semi-transmissive portion Q of the light exposure mask can be adjusted by adjusting the line width L and the space width S (or the width L of the rectangular pattern in the short-side direction and the space S in the short-side direction).

In the light exposure mask shown in each of FIGS. 1A to 1C, the relation between the resolution n of the light exposure apparatus, the projection magnification 1/m (m≧1), and the line width L (or the width L of the rectangular pattern in the short-side direction) satisfies L<(2n/3)×m.

In addition, in the light exposure mask satisfying the above relation, it is particularly effective to arrange the semi-transmissive potions Q on a side of the light shielding portion P, in other words, to arrange the semi-transmissive portion Q between the light shielding portion P and the transmissive portion R.

Embodiment Mode 2

This embodiment mode describes a process of forming a gate electrode of a TFT by patterning using the light exposure mask described in Embodiment Mode 1 and forming low-concentration impurity regions on both sides of a channel formation region in a self-aligned manner by using the gate electrode as a mask at the time of ion-doping.

First, a first insulating film (base insulating film) 102 is formed over a substrate 101 having an insulating surface. As the substrate 101 having an insulating surface, a light transmitting substrate such as a glass substrate, a crystallized glass substrate, or a plastic substrate can be used. When a thin film transistor to be formed later is applied to a top-emission light emitting display device or a reflective liquid crystal display device, a ceramic substrate, a semiconductor substrate, a metal substrate, or the like can also be used.

The first insulating film 102 is formed using a single layer or stacked layers of an insulating film such as a silicon oxide film, a silicon nitride film, or a silicon oxynitride ($SiO_xN_y$) film. Next, a semiconductor layer 103 is formed over the first insulating film 102.

The semiconductor layer 103 is formed as follows: a semiconductor film having an amorphous structure is formed by a known method such as a sputtering method, an LPCVD method, or a plasma CVD method; a crystalline semiconductor film that is crystallized by heat treatment is formed; a resist film is formed over the crystalline semiconductor film; and then the crystalline semiconductor film is patterned into a desired shape by using a first resist mask obtained by light exposure and development.

The semiconductor layer 103 is formed with a thickness of 25 nm to 80 nm (preferably, 30 nm to 70 nm). A material for the crystalline semiconductor film is not limited, but silicon, a silicon germanium (SiGe) alloy, or the like is preferably used.

As the heat treatment, a heating furnace, laser irradiation, irradiation with light emitted from a lamp instead of laser light (hereinafter referred to as lamp annealing), or a combination thereof can be used.

Alternatively, the crystalline semiconductor film may be formed by a thermal crystallization method in which the heat treatment is performed after adding a catalyst such as nickel. Note that when the crystalline semiconductor film is obtained by crystallization by the thermal crystallization method using a catalyst such as nickel, it is preferable to perform gettering treatment for removing the catalyst such as nickel after crystallization.

When the crystalline semiconductor film is formed by a laser crystallization method, a continuous wave laser beam (CW laser beam) or a pulsed laser beam can be used. As a laser beam that can be used here, a laser beam emitted from one or more kinds of a gas laser such as an Ar laser, a Kr laser, or an excimer laser; a laser using, as a medium, single crystal YAG, $YVO_4$, forsterite ($Mg_2SiO_4$), $YAlO_3$, or $GdVO_4$, or polycrystalline (ceramic) YAG, $Y_2O_3$, $YVO_4$, $YAVO_3$, or $GdVO_4$ doped with one or more of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser can be used. A crystal grain having a large diameter can be obtained by irradiation with the fundamental wave of the above laser beam or a second harmonic to a fourth harmonic of the fundamental wave. For example, the second harmonic (532 nm) or the third harmonic (355 nm) of a Nd:YVO$_4$ laser (the fundamental wave: 1064 nm) can be used. This laser can be both a CW laser and a pulsed laser. When emitted as a CW laser, a power density of the laser is required to be about 0.01 MW/cm$^2$ to 100 MW/cm$^2$ (preferably, 0.1 MW/cm$^2$ to 10 MW/cm$^2$). A scanning rate is set to about 10 cm/sec to 2000 cm/sec for irradiation.

Note that a laser using, as a medium, single crystal YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; an Ar ion laser; or a Ti: sapphire laser can be a CW laser. Alternatively, it can be pulsed at a repetition rate of 10 MHz or more by performing Q-switch operation, mode locking, or the like. When a laser beam is pulsed at a repetition rate of 10 MHz or more, the semiconductor film is irradiated with the following pulsed laser after being melted by a preceding laser and before being solidified. Therefore, unlike in the case of using a pulsed laser having a low repetition rate, the interface between the solid phase and the liquid phase can be moved continuously in the semiconductor film, so that crystal grains grown continuously in the scanning direction can be obtained.

When ceramic (polycrystal) is used as a medium, the medium can be formed into a desired shape in a short time at low cost. In the case of using a single crystal, a columnar medium having a diameter of several mm and a length of several tens of mm is generally used. However, in the case of using ceramic, a larger medium can be formed.

A concentration of a dopant such as Nd or Yb in a medium, which directly contributes to light emission, cannot be changed largely either in a single crystal or a polycrystal. Therefore, there is limitation to some extent on improvement in laser output by increasing the concentration. However, in the case of using ceramic, the size of a medium can be significantly increased compared with the case of using a single crystal, and thus, significant improvement in output can be expected.

Furthermore, in the case of using ceramic, a medium having a parallelepiped shape or a rectangular solid shape can be easily formed. When a medium having such a shape is used and emitted light proceeds in zigzag inside the medium, an emitted light path can be extended. Therefore, the light is amplified largely and can be emitted with high output. In addition, since a laser beam emitted from a medium having such a shape has a quadrangular cross-sectional shape at the time of emission, it has an advantage over a circular beam in being shaped into a linear beam. By shaping the laser beam emitted as described above using an optical system, a linear beam having a length of 1 mm or less on a shorter side and a length of several mm to several m on a longer side can be easily obtained. Further, by uniformly irradiating the medium with excited light, the linear beam has a uniform energy distribution in a long-side direction.

By irradiating the semiconductor film with this linear beam, the entire surface of the semiconductor film can be annealed more uniformly. When uniform annealing is required to both ends of the linear beam, a device of providing slits on the both ends so as to shield a portion where energy is decayed, or the like is necessary.

When the linear beam with uniform intensity obtained as described above is used for annealing the semiconductor film and an electronic device is manufactured using this semiconductor film, characteristics of the electronic device are favorable and uniform.

Next, if necessary, the semiconductor layer is doped with a slight amount of an impurity element (boron or phosphorus) to control a threshold value of a TFT. Here, an ion doping method in which diborane (B$_2$H$_6$) is not separated by mass but excited by plasma is used.

Then, after the first resist mask is removed, an oxide film on the surface of the semiconductor layer is removed by an etchant containing a hydrofluoric acid and the surface of the semiconductor layer is cleaned at the same time. Then, a second insulating film (gate insulating film) 104 is formed to cover the semiconductor layer. The second insulating film 104 is formed by a plasma CVD method, a sputtering method, or a thermal oxidation method with a thickness of 1 nm to 200 nm, preferably, 70 nm to 120 nm. As the second insulating film 104, a film made of an insulating film such as a silicon oxide film, a silicon nitride film, or a silicon oxynitride film is formed. Here, a silicon oxynitride film (composition ratio: Si=32%, O=59%, N=7%, and H=2%) is formed by a plasma CVD method with a thickness of 115 nm.

In addition, after forming a substrate, an insulating layer as a base film, a semiconductor layer, a gate insulating layer, an interlayer insulating layer, or the like, the surface of the substrate, the insulating layer as a base film, the semiconductor layer, the gate insulating layer, the interlayer insulating layer, or the like may be oxidized or nitrided by performing oxidization or nitridation with plasma treatment. When plasma treatment is used for oxidizing or nitriding the semiconductor layer or the insulating layer, the surface of the semiconductor layer or the insulating layer is modified, and a more dense insulating film than an insulating film formed by a CVD method or a sputtering method can be formed. Accordingly, defects such as a pin hole can be suppressed, and characteristics or the like of a semiconductor device can be improved. In addition, plasma treatment as described above can also be applied to a gate electrode layer, a source electrode layer, a drain electrode layer, a wiring layer, and the like, and a nitride film or an oxide film can be formed by performing nitridation or oxidation.

Note that when the film is oxidized by plasma treatment, the plasma treatment is performed under an oxygen atmosphere (for example, under an atmosphere including oxygen (O$_2$) and a rare gas (including at least one of He, Ne, Ar, Kr, and Xe), under an atmosphere including oxygen, hydrogen (H$_2$), and a rare gas, or under an atmosphere including dinitrogen monoxide and a rare gas). On the other hand, when the film is nitrided by plasma treatment, the plasma treatment is performed under a nitrogen atmosphere (for example, under an atmosphere including nitrogen (N$_2$) and a rare gas (including at least one of He, Ne, Ar, Kr, and Xe), under an atmosphere including nitrogen, hydrogen, and a rare gas, or under an atmosphere including NH$_3$ and a rare gas). As the rare gas, for example, Ar can be used. Alternatively, a mixed gas of Ar and Kr may be used. Consequently, the insulating film that is formed by plasma treatment contains a rare gas used for the plasma treatment (including at least one of He, Ne, Ar, Kr, and Xe), and the insulating film contains Ar in the case of using Ar.

In addition, when plasma treatment is performed to the second insulating film 104, the plasma treatment is performed under an atmosphere of the above described gas with an electron density of $1\times10^{11}$ cm$^{-3}$ or higher and an electron temperature of plasma of 1.5 eV or lower. More specifically, the plasma treatment is performed with an electron density of $1\times10^{11}$ cm$^{-3}$ to $1\times10^{13}$ cm$^{-3}$ and an electron temperature of plasma of 0.5 eV to 1.5 eV. Since electron density of plasma is high and electron temperature in the vicinity of an object to be treated (here, the second insulating film 104 functioning as a gate insulating layer) formed over the substrate is low, damage by plasma to the object to be treated can be prevented.

Further, since an electron density of plasma is high, $1\times10^{11}$ cm$^{-3}$ or higher, an oxide film or a nitride film, which is formed by oxidizing or nitriding the object to be treated using plasma treatment, has excellent uniformity in thickness or the like and dense film quality as compared with a film formed by a CVD method, a sputtering method, or the like. Moreover, since an electron temperature of plasma is low, 1.5 eV or lower, oxidizing or nitriding treatment can be performed at a lower temperature than that of conventional plasma treatment or thermal oxidation method. For example, oxidizing or nitriding treatment can be sufficiently performed even when performing plasma treatment at a temperature lower than a strain point of a glass substrate by 100° C. or more. Note that a high frequency such as a microwave (2.45 GHz) can be used as a frequency for forming plasma. Hereinafter, plasma treatment is performed under the above conditions if not otherwise mentioned.

Next, a stacked layer of a first conductive layer 105a and a second conductive layer 106a is formed. The stacked layer is not limited to two layers of the first conductive layer and the second conductive layer, and a stacked layer including three or more layers may also be employed.

The first conductive layer 105a is formed of refractory metal such as tungsten (W), chromium (Cr), tantalum (Ta), tantalum nitride (TaN), or molybdenum (Mo), or an alloy or a compound containing the refractory metal as a main component to have a thickness of 20 nm to 50 nm. In addition, the second conductive layer 106a is formed of refractory metal such as tungsten (W), chromium (Cr), tantalum (Ta), tantalum nitride (TaN), or molybdenum (Mo), or an alloy or a compound containing the refractory metal as a main component to have a thickness of 300 nm to 600 nm.

Here, two layers, that is, the first conductive layer and the second conductive layer are formed using different conductive materials, so that a difference in etching rate is generated in an etching step to be performed. A TaN film is used as the first conductive layer, and a tungsten film is used as the second conductive layer.

Figure 2A:
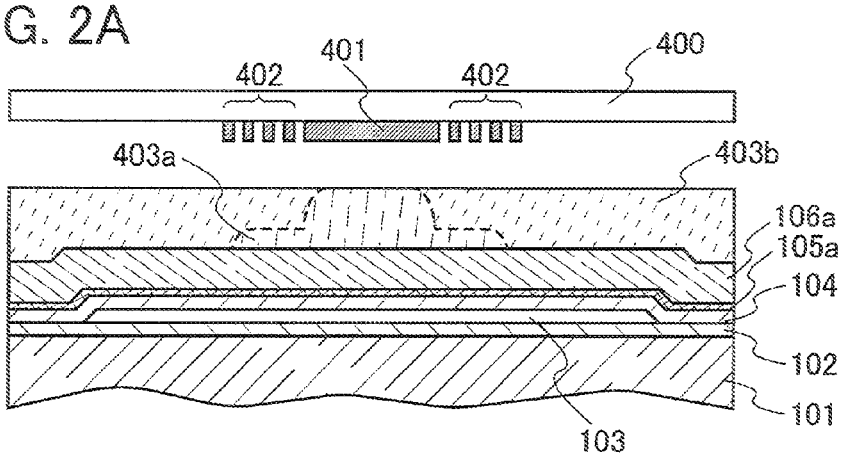
FIGS. 2A to 2D are cross-sectional views showing a manufacturing process for a semiconductor device (Embodiment Mode 2).

Next, after the entire surface of the second conductive layer 106a is coated with a resist film, light exposure is performed using a light exposure mask shown in FIG. 2A. Here, the second conductive layer 106a is coated with a resist film having a thickness of 1.5 μm, and a light exposure apparatus with a resolution of 1.5 μm and a projection magnification of 1:1 is used. Light used for light exposure is an i-line (wavelength: 365 nm), and light exposure energy is selected from the range of 20 mJ/cm$^2$ to 140 mJ/cm$^2$. In addition, light is not limited to the i-line. Light in which the i-line, a g-line (wavelength: 436 nm), and an h-line (wavelength: 405 nm) are mixed may also be used for light exposure.

In FIG. 2A, the light exposure mask is provided, over a light-transmitting substrate 400 which can transmit exposure light, with a light shielding portion 401 made of a metal film such as Cr and a semi-transmissive portion 402 having a light intensity reduction function where lines and spaces are repeatedly formed with respective predetermined line widths. When a line width of a light shielding material is L and a space width between light shielding materials is S in the semi-transmissive portion, a mask is used as the light exposure mask, in which the relation between the sum of L and S, a resolution n of the light exposure apparatus, and a projection magnification 1/m (m≧1) satisfies a conditional expression (n/3)×m≦L+S≦(3n/2)×m. Preferably, a light exposure mask is used in which the relation between the sum of L and S, n, and m satisfies a conditional expression (2n/3)×m≦L+S≦(6n/5)×m.

For example, a light exposure apparatus having a resolution of 1.5 μm and a projection magnification of 1:1 can be used, and a light exposure mask having a line width L of 0.5 μm and a space width S of 1.0 μm in the semi-transmissive portion can be used.

When the resist film is exposed to light using the exposure mask shown in FIG. 2A, a light-unexposed region 403a and a light-exposed region 403b are formed in the resist film. In light exposure, the light-exposed region 403b shown in FIG. 2A is formed by exposure light passing around the light-shielding portion 401 and passing through the semi-transmissive film 402.

Figure 2B:
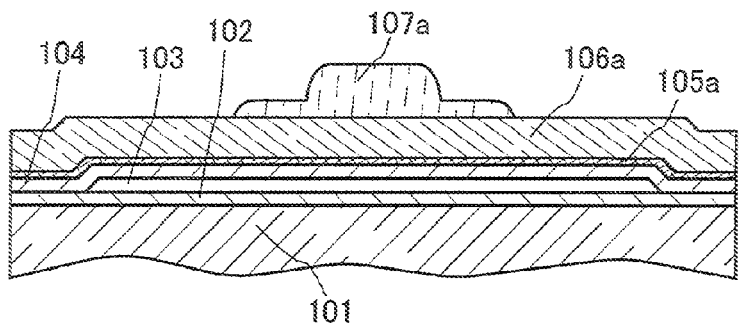

When development is performed, the light-exposed region 403b is removed, and a resist pattern 107a having a thick region and a region thinner than the thick region on a side can be obtained over the second conductive layer 106a as shown in FIG. 2B. In the resist pattern 107a, a resist thickness in the thin region can be adjusted by adjusting light exposure energy. By using the light exposure mask shown in FIG. 2A, the thin region of the resist pattern can also be formed with uniform thickness.

Next, the second conductive layer 106a and the first conductive layer 105a are etched by dry etching. The dry etching is performed while ashing the resist pattern 107a. As the etching gas, CF$_4$, SF$_6$, Cl$_2$, and/or O$_2$ is used. A dry etching apparatus using a high-density plasma source such as ECR (Electron Cyclotron Resonance) or ICP (Inductively Coupled Plasma) is used to improve an etching rate. Note that the second insulating film 104 is also etched and partially becomes thin depending on etching conditions.

Note that an example of using an ICP etching apparatus is described here, but there is no particular limitation. For example, a parallel plate etching apparatus, a magnetron etching apparatus, an ECR etching apparatus, or a helicon etching apparatus may be used. In addition, etching is not limited to a dry etching method. A wet etching method may be employed, or a combination of a dry etching method and a wet etching method may be used.

Figure 2C:
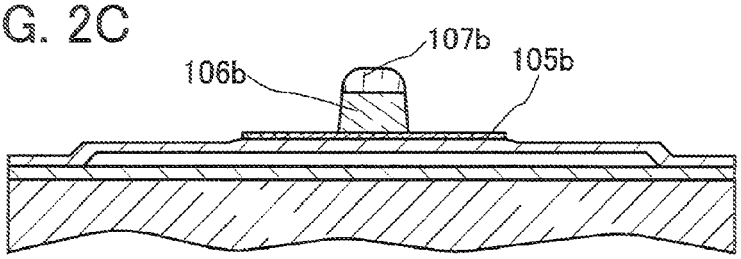

In such a manner, a conductive stacked pattern including the first conductive layer 105b and the second conductive layer 106b is formed over the second insulating film 104 as shown in FIG. 2C. Through etching, both side walls of the first conductive layer 105b are exposed, and further, a region which is not overlapped with the second conductive layer 106b is exposed. Note that each side wall of the first conductive layer 105b may have a tapered shape. Further, each side wall of the second conductive layer 106b may also have a tapered shape.

Next, after a resist pattern 107b is removed, an impurity imparting one conductivity type is added to the semiconductor layer 103. Here, phosphorus (or As) is used as an ion of the impurity imparting one conductivity type, and an n-channel TFT is manufactured. By using the conductive stacked pattern, an LDD region, a source region, and a drain region can be formed in a self-alignment manner without forming a sidewall.

When performing doping treatment for forming a source region and a drain region in the semiconductor layer and outside the gate electrode, an ion of the impurity imparting one conductivity type may be added to the semiconductor layer 103 using the conductive stacked pattern as a mask to form high-concentration impurity regions 110 and 111 having one conductivity type. As for doping conditions for forming the source region and the drain region, doping is performed at an acceleration voltage of 50 kV to 100 kV. An impurity concentration of each of the high-concentration impurity regions 110 and 111 having one conductivity type is set to $1\times10^{19}/cm^3$ to $5\times10^{21}/cm^3$ (the peak value by a SIMS measurement).

In addition, when performing doping treatment for forming an LDD region which is overlapped with the gate electrode, an ion of an impurity imparting one conductivity type may be added to the semiconductor layer 103 through the first conductive layer 105b in a region which is not overlapped with the second conductive layer to form low-concentration impurity regions 109a and 109b having one conductivity type. As for doping conditions, this case requires an accelerating voltage of 60 kV to 100 kV, although doping conditions depend on the thickness of the second insulating layer and the first conductive layer. An impurity concentration of each of the low-concentration impurity regions 109a and 109b having one conductivity type is set to $1\times10^{17}/cm^3$ to $5\times10^{19}/cm^3$ (the peak value by a SIMS measurement), on the premise that it is an LDD region.

Note that the order of doping is not particularly limited, and doping treatment for forming an LDD region may be performed after performing doping treatment for forming a source region and a drain region. Alternatively, doping treatment for forming a source region and a drain region may be performed after performing doping treatment for forming an LDD region.

Although an example of separately performing doping treatment twice to form impurity regions having different concentrations is described here, impurity regions having different concentrations may be formed by single doping treatment by adjusting treatment conditions.

In addition, although an example of removing a resist pattern before doping is described here, the resist pattern may alternatively be removed after doping treatment. When doping is performed with a resist pattern left, doping can be performed while protecting the surface of the second conductive layer with the resist pattern.

Note that, in the case of performing the above doping treatment, the semiconductor layer in a position overlapped with the second conductive layer is a region to which the ion of the impurity imparting one conductivity type is not added and functions as a channel formation region of a TFT to be formed later.

In addition, the conductive stacked pattern (the first conductive layer 105b and the second conductive layer 106b) in a portion intersecting with the semiconductor layer 103 serves as a gate electrode. In addition, each of the low-concentration impurity regions 109a and 109b overlapped with the gate electrode is referred to as a $L_{ov}$ region. The $L_{ov}$ region is formed using a region of the first conductive layer 105b, which is not overlapped with the second conductive layer 106b. The necessary length of the $L_{ov}$ region may be determined in accordance with a type or an application of a circuit including a TFT, and a photomask or etching conditions may be set based on the length.

Subsequently, a third insulating film 112 is formed using silicon nitride oxide. Then, the impurity element added to the semiconductor layer is activated and hydrogenated.

Next, a fourth insulating film 113 is formed using a light transmitting inorganic material (such as silicon oxide, silicon nitride, or silicon oxynitride) or an organic compound material having a low dielectric constant (a photosensitive or non-photosensitive organic resin material such as polyimide or polybenzoxazole). Alternatively, the fourth insulating film may be formed using a material containing siloxane. Note that siloxane is a material including a skeleton structure formed by a bond of silicon (Si) and oxygen (O). As a substituent, an organic group containing at least hydrogen (for example, an alkyl group or aromatic hydrocarbon) is used. Alternatively, a fluoro group may be used as the substituent. Still alternatively, an organic group containing at least hydrogen and a fluoro group may be used as the substituent.

Then, a mask made of a resist is formed using a third photomask, and the third insulating film 112 and the fourth insulating film 113 functioning as interlayer insulating films, and the second insulating film 104 functioning as a gate insulating film are selectively etched to form contact holes. After that, the mask made of a resist is removed.

After a metal stacked film is formed over the fourth insulating film 113 by a sputtering method, a mask of a resist is formed using a fourth photomask, and the metal stacked film is selectively etched to form source and drain electrodes 114 and 115 which are in contact with the semiconductor layer.

Note that a connection electrode (an electrode for electrically connecting plural TFTs to each other) and a terminal electrode (an electrode for connection with an external power supply) can also be formed over the fourth insulating film 113 at the same time as the formation of the source and drain electrodes 114 and 115 of a TFT. Then, the mask made of a resist is removed. Note that the metal stacked film has a stacked structure of three layers, such as a Ti film with a thickness of 100 nm, an Al film containing a slight amount of Si with a thickness of 350 nm, and a Ti film with a thickness of 100 nm. It is preferable to form the metal stacked film continuously in the same metal sputtering apparatus.

Figure 2D:
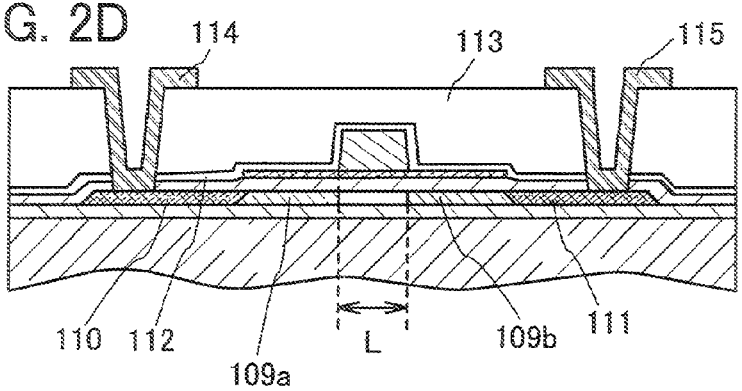

Through the above steps, a top-gate TFT including the low-concentration impurity regions 109a and 109b on both sides of the channel formation region is formed as shown in FIG. 2D.

As described above, in this embodiment mode, the resist pattern 107a including a photoresist layer in the semi-transmissive portion with small and uniform thickness is formed by performing light exposure using the light exposure mask including the semi-transmissive portion as shown in FIG. 2A, and the gate electrode is obtained using the resist pattern. Then, the low-concentration impurity regions overlapped with the gate electrode are formed in a self-aligned manner on both sides of the channel formation region by using the gate electrode as a mask at the time of ion doping.

By manufacturing a semiconductor device which includes a TFT (a GOLD structure: Gate-drain overlapped LDD) having a low-concentration impurity region overlapped with a gate electrode ($L_{ov}$ region) in a self-aligned manner, the number of masks can be reduced, and precise alignment in manufacturing a GOLD structure becomes unnecessary. Accordingly, many steps such as substrate cleaning, resist material application, pre-bake, light exposure, development, and post-bake can be eliminated, and processing time can be shortened. In addition, manufacturing cost can be reduced and product yield can be improved.

In this embodiment mode, the formation of a $L_{ov}$ region can suppress generation of hot carriers and prevent deterioration of a semiconductor element. This $L_{ov}$ region can be formed in a self-aligned manner. Further, there is no limitation on length (length in a channel length direction), and the length can be sufficiently secured. Moreover, $L_{ov}$ regions on both sides of a channel formation region can be formed with different lengths.

The semiconductor device includes various circuits, and there are cases in which a GOLD structure having a $L_{ov}$ region with a good hot carrier countermeasure effect is suitable, in which a structure having a $L_{off}$ region (low-concentration impurity region which is not overlapped with a gate electrode) with a small off-current value is suitable, and in which a structure having only source and drain regions without having a low-concentration impurity region is suitable, depending on conditions. In this embodiment mode, each circuit can be separately formed with a GOLD structure or another structure over the same substrate.

This embodiment mode describes an example of forming a gate electrode including a thick first region and a second region thinner than the first region on a side of the first region by using a light exposure mask including a semi-transmissive portion as shown in FIG. 2A. However, also in forming another electrode, wire, or the like as well as the gate electrode, an electrode, a wire, or the like having a thick region and a thin region on a side of the thick region can be obtained by using a light exposure mask including a semi-transmissive portion as shown in FIG. 2A.

In this embodiment mode, explanation is made using an n-channel TFT; however, a p-channel TFT can be formed by using an impurity element imparting p-type conductivity (an impurity element belonging to Group 13 of the periodic table, typified by boron or the like) instead of an impurity element imparting n-type conductivity (an impurity element belonging to Group 15 of the periodic table, typified by phosphorus or arsenic).

Further, an n-channel TFT and a p-channel TFT can be formed over the same substrate, and by combining these TFTs complementarily, a CMOS circuit can also be formed. The CMOS circuit refers to a circuit having at least one n-channel TFT and one p-channel TFT (such as an inverter circuit, a NAND circuit, an AND circuit, a NOR circuit, an OR circuit, a shift register circuit, a sampling circuit, a D/A converter circuit, an A/D converter circuit, a latch circuit, or a buffer circuit). In addition, by combining these CMOS circuits, a memory element such as an SRAM or a DRAM or other elements can be formed over the substrate. Moreover, a CPU can also be formed over the substrate by integrating various elements and circuits.

In addition, both a top-gate TFT with the above structure (the structure having $L_{ov}$ regions with the same width on both sides of a channel formation region) and a top-gate TFT with a structure having a wider $L_{ov}$ region on one side of the channel formation region than that on the other side can be formed over the same substrate only by changing a light exposure mask without increasing the number of steps.

In this embodiment mode, explanation is made using a top-gate TFT with a single-gate structure; however, a top-gate TFT with a multi-gate structure having a plurality of channel formation regions can also be formed. In addition, a top-gate TFT with a single-gate structure and a top-gate TFT with a multi-gate structure can be formed over the same substrate only by changing a light exposure mask without increasing the number of steps.

Therefore, various circuits can be formed over the same substrate by forming transistors with optimal structures without increasing the number of manufacturing steps.

This embodiment mode can be freely combined with Embodiment Mode 1.

Embodiment Mode 3

A method for forming the conductive stacked pattern described in Embodiment Mode 2 is not particularly limited. Here, an example of forming a conductive stacked pattern by changing etching conditions a plurality of times during the process is explained with reference to FIGS. 3A to 3F.

Figure 3A:
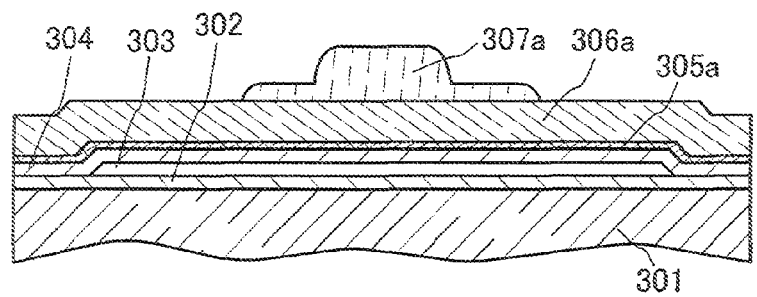
FIGS. 3A to 3F are cross-sectional views showing a manufacturing process for a semiconductor device (Embodiment Mode 3).

First, similarly to Embodiment Mode 2, a resist pattern 307a is formed over a second conductive layer 306a. FIG. 3A corresponds to FIG. 2B.

Note that in FIG. 3A, a first insulating film (base insulating film) 302, a semiconductor layer 303, and a second insulating film (gate insulating film) 304 are formed over a substrate 301, and a first conductive layer 305a and a second conductive layer 306a are formed thereover.

Figure 3B:
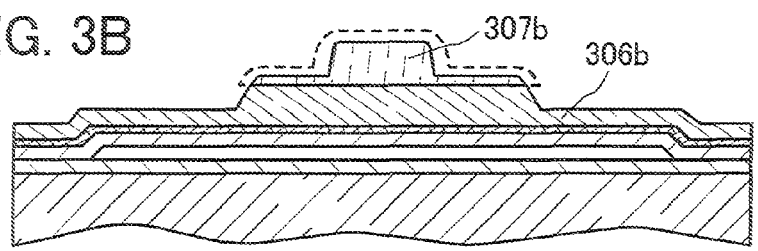

Next, etching is performed under first etching conditions to form a resist pattern 307b and a second conductive layer 306b each having a step as shown in FIG. 3B. A part of the second conductive film 306b is formed into a tapered shape under the first etching conditions.

Figure 3C:
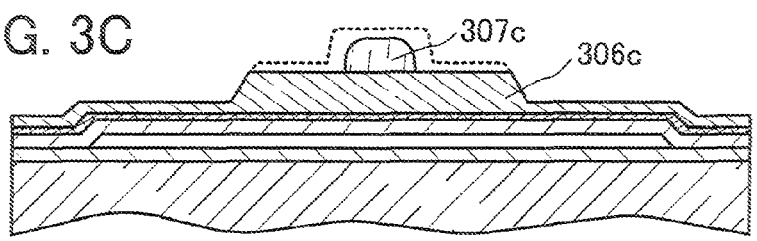

Subsequently, etching is continuously performed under the first etching conditions to obtain a state shown in FIG. 3C. At this stage, a resist pattern 307c without a step is formed. While forming a part of a second conductive layer 306c into a tapered shape, thickness is reduced.

Figure 3D:
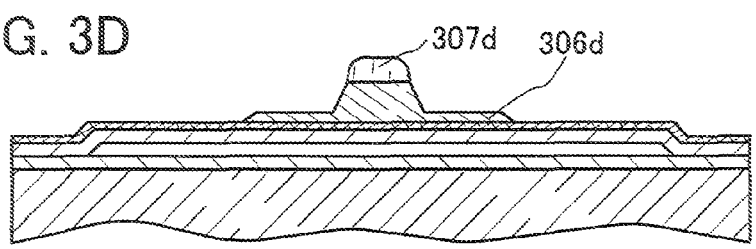
Figure 3E:
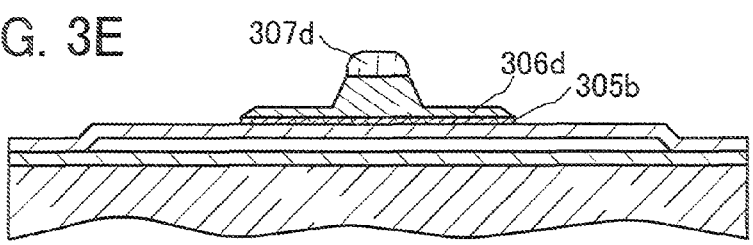
Figure 3F:
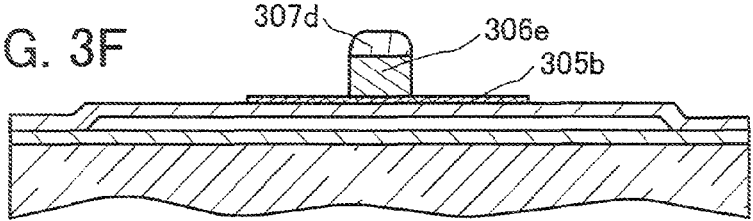

Then, etching is continuously performed under the first etching conditions to obtain a state shown in FIG. 3D. The size of the resist pattern is further reduced to form a resist pattern 307d. A projecting second conductive layer 306d including a thick first region and second regions thinner than the first region on both sides of the first region is formed, and a part of the first conductive layer 305a is exposed.

Next, etching is performed under second etching conditions using the projecting second conductive layer 306d as a mask to form a first conductive layer 305b.

Subsequently, anisotropic etching is performed under third etching conditions to form a second conductive layer 306e. In this anisotropic etching, it is important that a difference in etching rate is large between the first conductive layer and the second conductive layer, and it is preferable to use different conductive materials for the first conductive layer and the second conductive layer. In addition, by adjusting the third etching conditions, it is also possible to prevent the second insulating film from being partially thinned by this anisotropic etching.

As described above, when the conductive stacked pattern is formed by changing etching conditions finely, variations in the shape of the conductive stacked pattern can be suppressed.

The subsequent steps are the same as those in Embodiment Mode 2; thus, detailed explanation thereof is omitted here.

This embodiment mode can be freely combined with Embodiment Mode 1 or 2.

Embodiment Mode 4

Figure 4A:
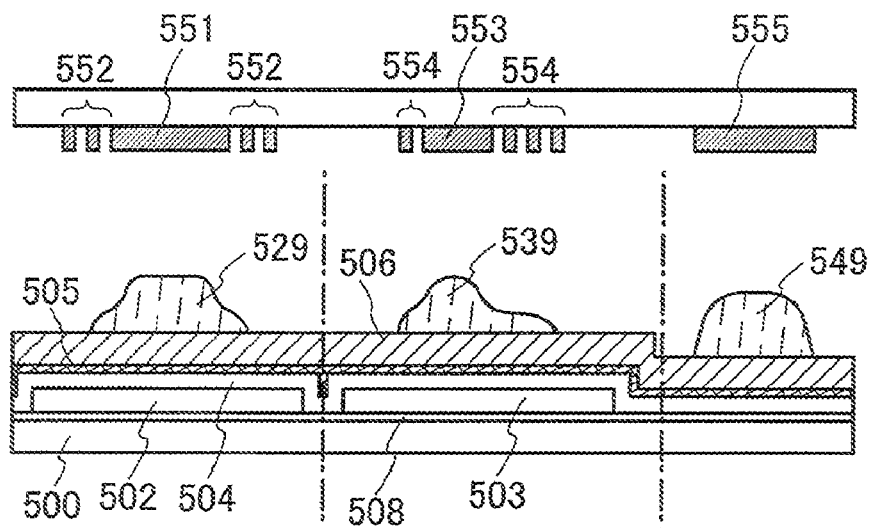
FIGS. 4A to 4C are cross-sectional views showing a manufacturing process for a semiconductor device (Embodiment Mode 4).
Figure 4B:
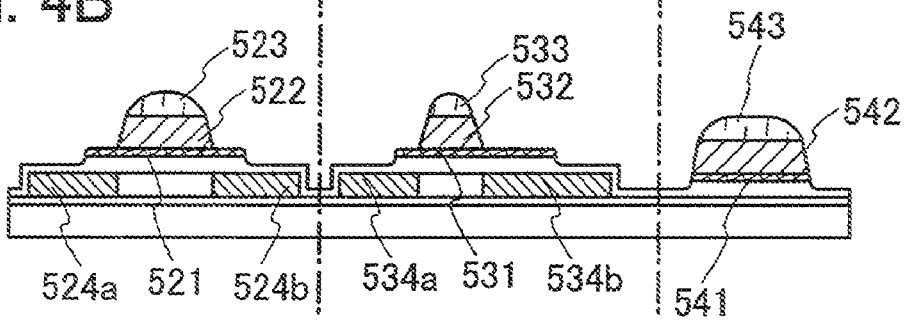
Figure 4C:
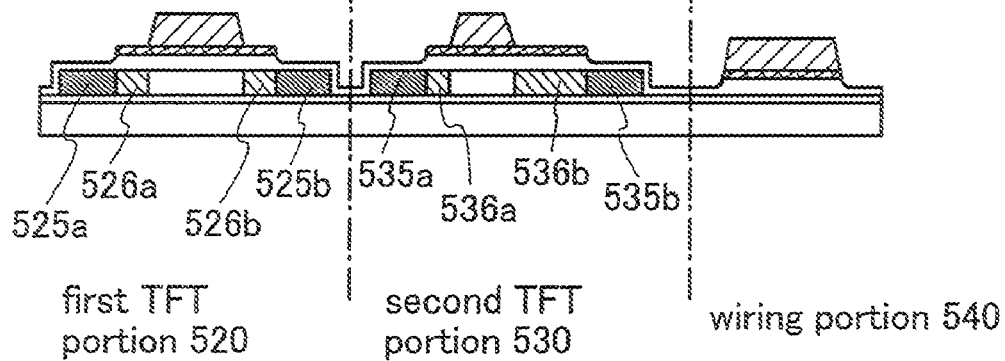

Here, FIGS. 4A to 4C show an example of forming a top-gate TFT with the above structure (the structure having $L_{ov}$ regions with the same width on both sides of a channel formation region) and a top-gate TFT with a structure having a wider $L_{ov}$ region on a drain side than that on a source side over the same substrate only by changing a light exposure mask without increasing the number of steps.

In FIG. 4A, semiconductor layers 502 and 503 are formed over a substrate 500 and an insulating layer 508. A gate insulating layer 504, a first conductive film 505, and a second conductive film 506 are formed to cover the semiconductor layers 502 and 503, and resist patterns 529, 539, and 549 having different shapes are formed using a light exposure mask.

These resist patterns can be formed using a light exposure mask shown in FIG. 4A. Similarly to Embodiment Mode 1 or 2, a line width of a light shielding material in the semi-transmissive portion is L and a space width between light shielding materials is S, and a light exposure mask is used in which the relation between the sum of L and S, a resolution n of a light exposure apparatus, and a projection magnification 1/m (m≧1) satisfies a conditional expression (n/3)×m≦L+

S≦(3n/2)×m. Preferably, a light exposure mask is used in which the relation between the sum of L and S, n, and m satisfies a conditional expression (2n/3)×m≦L+S≦(6n/5)×m. The arrangement, material, shape, and the like of the semi-transmissive portion can be similar to those described in Embodiment Mode 1 or 2. A projection-type light exposure apparatus can be used as the light exposure apparatus. A light exposure apparatus with a projection magnification of 1:1 or a reduced-projection light exposure apparatus with a projection magnification of 1/m can be used.

The resist pattern 529 is formed using a mask provided with semi-transmissive portions 552 with the same width on both sides of a light shielding portion 551; the resist pattern 539 is formed using a light exposure mask provided with a wide semi-transmissive portion 554 on one side of a light shielding portion 553 and a narrow semi-transmissive portion 554 on the other side; and the resist pattern 549 is formed using a light exposure mask provided with only a light shielding portion 555. The resist pattern 529 has a shape with gentle steps on both sides (a symmetrical shape in the cross-section of FIG. 4A); the resist pattern 539 has a shape with a projecting portion in a position which is shifted from the center (an asymmetrical shape in the cross-section of FIG. 4A); and the resist pattern 549 has a shape without a step, a projection, and a depression (a symmetrical shape in the cross-section of FIG. 4A).

Patterning is performed by etching treatment using the resist patterns 529, 539, and 549 to form a first gate electrode layer 521, a second gate electrode layer 522, a first gate electrode layer 531, a second gate electrode layer 532, a first wiring layer 541, and a second wiring layer 542.

An impurity element imparting one conductivity type is added to the semiconductor layers 502 and 503 using the second gate electrode layers 522 and 532 as masks to form low-concentration impurity regions 524a, 524b, 534a, and 534b (see FIG. 4B).

Further, an impurity element imparting one conductivity type is added to the semiconductor layers 502 and 503 using the first gate electrode layer 521, the second gate electrode layer 522, the first gate electrode layer 531, and the second gate electrode layer 532 as masks to form high-concentration impurity regions 525a, 525b, 535a, and 535b.

Then, resist patterns 523, 533, and 543 are removed.

In this manner, a first TFT portion 520, a second TFT portion 530, and a wiring portion 540 can be formed over the same substrate. The first TFT portion 520 is provided with a TFT including a low-concentration impurity region 526a on a source side and a low-concentration impurity region 526b on a drain side. The low-concentration impurity region 526a and the low-concentration impurity region 526b are formed with the same width. The second TFT portion 530 is provided with a TFT including low-concentration impurity regions 536a and 536b on both sides of a channel formation region. Note that the low-concentration impurity region 536b is wider than the low-concentration impurity region 536a (see FIG. 4C). The wiring portion 540 is provided with stacked layers of which positions of edges correspond to each other, that is, stacked layers of the first wiring layer 541 and the second wiring layer 542.

In addition, by using the same resist pattern, the same structure as that of the second TFT portion 530 can be formed, so that a capacitor and a TFT can be formed over the same substrate. In that case, a capacitor using the gate insulating layer 504 as a dielectric can also be formed.

This embodiment mode can be freely combined with Embodiment Mode 1, 2, or 3.

Embodiment Mode 5

In this embodiment mode, a structure of an active-matrix light emitting device and a manufacturing method thereof are hereinafter explained with reference to FIGS. 5 and 6.

First, a base insulating film is formed over a substrate 610 having an insulating surface. When light emission is extracted with the substrate 610 side as a display surface, the substrate 610 may be a glass substrate or a quartz substrate having a light-transmitting property. Further, a light transmitting plastic substrate having a heat resistant property which can withstand a processing temperature may be used. On the other hand, when light emission is extracted with an opposite surface to the substrate 610 side as a display surface, a silicon substrate, a metal substrate, or a stainless steel substrate of which surface is covered with an insulating film may be used in place of the above substrates. Here, a glass substrate is used as the substrate 610. Note that a refractive index of the glass substrate is around 1.55.

As a base insulating film 611, a base film made of an insulating film such as a silicon oxide film, a silicon nitride film, or a silicon oxynitride film is formed. Here, an example of using a single layer structure as the base film is described; however, a structure of stacking two or more insulating films may be employed. Note that the base insulating film is not necessarily formed when unevenness of the substrate and impurity diffusion from the substrate do not cause a problem.

Next, a semiconductor layer is formed over the base insulating film. The semiconductor layer is formed as follows: after a semiconductor film having an amorphous structure is formed by a known method such as a sputtering method, an LPCVD method, or a plasma CVD method; and then, a crystalline semiconductor film obtained by performing known crystallization treatment such as a laser crystallization method, a thermal crystallization method, or a thermal crystallization method using a catalyst such as nickel is patterned into a desired shape by using a first photomask. Note that the base insulating film and the semiconductor film having an amorphous structure can be stacked continuously without being exposed to the atmosphere by using a plasma CVD method. A thickness of this semiconductor film is 25 nm to 80 nm (preferably, 30 nm to 70 nm). A material for the crystalline semiconductor film is not particularly limited, but silicon, a silicon-germanium (SiGe) alloy, or the like is preferably used.

Here, as a technique for crystallizing the semiconductor film having an amorphous structure, the technique disclosed in Japanese Patent Laid-Open No. H8-78329 is used. According to the technique disclosed in the gazette, a metal element which promotes crystallization is selectively added to an amorphous silicon film, and a semiconductor film having a crystalline structure expanding from the added region is formed by performing heat treatment.

Hereinafter, one example of a method for forming the crystalline semiconductor film is explained in detail.

First, the surface of the semiconductor film having an amorphous structure is coated by a spinner with a nickel acetate solution containing a catalytic metal element for promoting crystallization (here, nickel) of 1 ppm to 100 ppm by weight, and a nickel-containing layer is formed. As an alternative method for forming the nickel-containing layer other than the coating, a method for forming an extremely thin film by a sputtering method, an evaporation method, or plasma treatment may be employed. In addition, although an example of coating the entire surface is shown here, the nickel-containing layer may be selectively formed by using a mask.

Next, heat treatment is performed for crystallization. In this case, a silicide is formed in a portion of the semiconductor film that is in contact with the metal element for promoting crystallization of the semiconductor, and crystallization proceeds using the silicide as a nucleus. In this manner, a semiconductor film having a crystalline structure is formed. Note that the concentration of oxygen contained in the semiconductor film after the crystallization is preferably $5\times10^{18}/cm^3$ or lower. Here, after performing heat treatment for dehydrogenation (500° C. for 1 hour), heat treatment for crystallization (550° C. to 650° C. for 4 to 24 hours) is performed. In the case of performing crystallization by intense light irradiation, any one of infrared light, visible light, and ultraviolet light, or a combination thereof can be used. Note that, if necessary, heat treatment for releasing hydrogen contained in the semiconductor film having an amorphous structure may be performed before the intense light irradiation. Alternatively, heat treatment and intense light irradiation may be simultaneously performed for crystallization. In view of productivity, crystallization is preferably performed by intense light irradiation.

In the crystalline semiconductor film obtained in such a manner, the metal element (here, nickel) remains. Although the metal element is not uniformly distributed in the film, it remains in a concentration over $1\times10^{19}/cm^3$ on average. It is needless to say that various semiconductor elements such as TFTs can be formed even in such a state; however, the metal element is removed by the following gettering method.

Here, a natural oxide film formed in the crystallization step is removed before laser light irradiation. This natural oxide film contains nickel at high concentration; therefore, it is preferably removed.

Next, in order to increase a crystallization rate (proportion of the crystalline component to a total volume of the film) and repair defects remaining in the crystal grains, the crystalline semiconductor film is irradiated with laser light. In the case of irradiating the crystalline semiconductor film with laser light, distortions or ridges are formed in the semiconductor film, and a thin surface oxide film (not shown) is formed on the surface. As this laser light, excimer laser light with a wavelength of 400 nm or less that is emitted from a pulsed laser light source, or the second or third harmonic of a YAG laser may be employed. Alternatively, the second to fourth harmonics of the fundamental wave may be used with the use of a solid-state laser capable of continuous wave oscillation. Typically, the second harmonic (532 nm) or the third harmonic (355 nm) of a Nd:YVO$_4$ laser (fundamental wave: 1064 nm) may be employed.

Subsequently, first heat treatment for reducing distortions of the crystalline semiconductor film (heat treatment for heating the semiconductor film to about 400° C. to 1000° C. momentarily) is performed in a nitrogen atmosphere, and a flat semiconductor film is obtained. As the heat treatment for heating momentarily, heat treatment by intense light irradiation or heat treatment to put the substrate into a heated gas and take out the substrate after a few minutes may be employed. Depending on conditions of the heat treatment, distortions are reduced and at the same time, defects remaining in the crystal grains are repaired, in other words, crystallinity can be improved. Further, by this heat treatment, distortions are reduced, and thus, nickel can be easily gettered in a subsequent gettering step. Note that when a temperature in the heat treatment is lower than a temperature in the crystallization, nickel moves in a silicon film in a solid phase state.

Then, a semiconductor film containing a rare gas element is formed over the crystalline semiconductor film. An oxide film to serve as an etching stopper (referred to as a barrier layer) may be formed with a thickness of 1 nm to 10 nm before forming the semiconductor film containing a rare gas element. The barrier layer may be formed at the same time as the heat treatment for reducing distortions of the semiconductor film.

The semiconductor film containing a rare gas element is formed by a plasma CVD method or a sputtering method, and a gettering site with a thickness of 10 nm to 300 nm is formed. The rare gas element is one or plural kinds of elements selected from helium (He), neon (Ne), argon (Ar), krypton (Kr), and xenon (Xe). Among them, argon (Ar) that is an inexpensive gas is preferable.

Here, a PCVD method is used. Deposition is performed using monosilane and argon as a material gas, of which ratio (monosilane:argon) is controlled to 0.1:99.9 to 1:9, preferably, 1:99 to 5:95. RF power density at the time of deposition is preferably 0.0017 W/cm$^2$ to 0.48 W/cm$^2$. High RF power density offers film quality enough to provide a gettering effect and improves deposition rate. In addition, a pressure at the time of deposition is prefereably 1.333 Pa (0.01 Torr) to 133.322 Pa (1 Torr). The pressure is desirably as high as possible because the deposition rate is improved. However, when the pressure is high, the concentration of Ar contained in the film is decreased. Deposition temperature is preferably 300° C. to 500° C. In this manner, a semiconductor film can be formed by a plasma CVD method, which contains argon at a concentration of $1\times10^{18}/cm^3$ to $1\times10^{22}/cm^3$, preferably, $1\times10^{20}/cm^3$ to $1\times10^{21}/cm^3$. By controlling deposition conditions for the semiconductor film containing a rare gas element within the ranges described above, damage to the barrier layer during deposition can be reduced, so that variation in thickness of the semiconductor film and defects such as holes formed in the semiconductor film can be prevented from generating.

There are two meanings in the inclusion of an ion of a rare gas element that is an inert gas in the film. One is to form a dangling bond and the other is to distort the semiconductor film. In order to distort the semiconductor film, it is remarkably effective to use an element that has a larger atomic radius than that of silicon, such as argon (Ar), krypton (Kr), or xenon (Xe). In addition, when the film contains the rare gas element, not only is the semiconductor film distorted but also a dangling bond is formed, which contributes to gettering action.

Subsequently, heat treatment is performed to perform gettering for reducing the concentration of the metal element (nickel) in the crystalline semiconductor film, or removing the metal element. As the heat treatment for gettering, treatment by intense light irradiation, heat treatment using a furnace, or heat treatment to put the substrate into a heated gas and take out the substrate after several minutes may be employed. Here, second heat treatment for performing gettering (heat treatment for heating the semiconductor film to about 400° C. to 1000° C. momentarily) is performed in a nitrogen atmosphere.

By this second heat treatment, the metal element moves to the semiconductor film containing a rare gas element, and the metal element contained in the crystalline semiconductor film covered with the barrier layer is removed or the concentration of the metal element is reduced. The metal element contained in the crystalline semiconductor film moves in a direction perpendicular to the substrate surface and toward the semiconductor film containing a rare gas element.

The distance that the metal element moves in gettering may be approximately equal to the thickness of the crystalline semiconductor film, and thus, gettering can be completed in a relatively short time. Here, nickel is moved to the semiconductor film containing a rare gas element so that nickel is not segregated in the crystalline semiconductor film, and gettering is sufficiently performed so that the crystalline semiconductor film contains almost no nickel, in other words, a concentration of nickel in the film is $1 \times 10^{18}/cm^3$ or lower, preferably, $1 \times 10^{17}/cm^3$ or lower. Note that not only the semiconductor film containing a rare gas element but also the barrier layer functions as a gettering site.

Subsequently, only the semiconductor film containing a rare gas element is selectively removed using the barrier layer as an etching stopper. As a method for selectively etching only the semiconductor film containing a rare gas element, dry etching without using plasma by $ClF_3$, or wet etching using an alkaline solution such as an aqueous solution containing hydrazine or tetraethylammonium hydroxide (($CH_3$)$_4$NOH) (abbr.: TMAH) can be used. Note that over-etching time is made shorter so as to prevent a pin hole from being formed in the crystalline semiconductor film by this etching.

Next, the barrier layer is removed by an etchant containing a hydrofluoric acid.

In addition, before forming the semiconductor film containing a rare gas element, flushing treatment using a flush substance may be performed to remove an impurity such as F in a chamber. Treatment (also referred to as flushing treatment or silane flush) for preventing an impurity from attaching to the substrate is performed by coating an inner wall of the chamber while introducing monosilane as a flush substance with a gas flow rate of 8 SLM to 10 SLM for 5 minutes to 20 minutes, preferably, 10 minutes to 15 minutes. Note that 1 SLM corresponds to 1000 sccm, that is, 0.06 m$^3$/h.

Through the above steps, a favorable crystalline semiconductor film can be obtained.

After the crystalline semiconductor film is patterned into a desired shape using the first photomask, a resist mask is removed. Subsequently, if necessary, the semiconductor layer is doped with a slight amount of an impurity element (boron or phosphorus) to control a threshold value of a TFT. Here, an ion doping method in which diborane ($B_2H_6$) is not separated by mass but excited by plasma is used.

Then, an oxide film on the surface of the semiconductor layer is removed by using an etchant containing a hydrofluoric acid, and at the same time, the surface of the semiconductor layer is cleaned.

Next, an insulating film is formed to cover the semiconductor layer. The insulating film is formed by a plasma CVD method or a sputtering method with a thickness of 1 nm to 200 nm. The insulating film is preferably formed with a small thickness, 10 nm to 50 nm in a single-layer structure or a stacked-layer structure of an insulating film containing silicon, and then, surface nitriding treatment using plasma with a microwave is performed. The insulating film functions as a gate insulating film of a TFT to be formed later.

Subsequently, a first conductive film with a thickness of 20 nm to 100 nm and a second conductive film with a thickness of 100 nm to 400 nm are stacked over the insulating film. In this embodiment mode, a tantalum nitride film with a thickness of 30 nm and a tungsten film with a thickness of 370 nm are sequentially stacked over the insulating film 613, and each gate electrode and each wire are formed using the light exposure mask including a semi-transmissive portion having a light intensity reduction function described in Embodiment Mode 1 or 2. A projection-type light exposure apparatus can be used as a light exposure apparatus. Alternatively, a light exposure apparatus with a projection magnification of 1:1 or a reduced-projection light exposure apparatus with a projection magnification of 1/m can be used.

Note that the conductive film is a stacked layer of a TaN film and a W film here; however, there is no particular limitation. The conductive film may be a stacked layer of an element selected from Ta, W, Ti, Mo, Al, and Cu, or an alloy material or a compound material containing the above-described element as a main component. Alternatively, a semiconductor film typified by a polycrystalline silicon film doped with an impurity element such as phosphorus may be used. Furthermore, it is not limited to a two-layer structure, and for example, a three-layer structure in which a tungsten film with a thickness of 50 nm, an aluminum silicon alloy (Al—Si) film with a thickness of 500 nm, and a titanium nitride film with a thickness of 30 nm are sequentially stacked may also be employed.

An ICP (Inductively Coupled Plasma) etching method is preferably used for etching the first conductive film and the second conductive film (first etching treatment and second etching treatment). By using an ICP etching method and appropriately adjusting etching conditions (the amount of power applied to a coil-shaped electrode, the amount of power applied to an electrode on a substrate side, an electrode temperature on a substrate side, and the like), the films can be etched into desired shapes.

Next, a first doping step in which doping is performed on the entire surface using a gate electrode as a mask is performed to add an impurity element imparting n-type conductivity to the semiconductor layer. The first doping step may be performed by an ion doping method or an ion implantation method. The ion doping method is performed under conditions where the dose amount is $1.5 \times 10^{14}$ atoms/cm$^2$ and the accelerating voltage is 60 kV to 100 kV. Through the first doping step, by adding an impurity element to the semiconductor layer through a region of the first conductive film which is not overlapped with the second conductive film, a low-concentration impurity region overlapped with the gate electrode can be formed. As the impurity element imparting n-type conductivity, phosphorus (P) or arsenic (As) is typically used.

After forming a mask of a resist, a second doping step for doping the semiconductor layer with an impurity element imparting n-type conductivity at higher concentration than that in the first doping step is performed. The mask is provided to protect a source region and a drain region of the semiconductor layer forming a p-channel TFT in a pixel portion and a region in the periphery thereof, a part of an n-channel TFT in the pixel portion, and a source region and a drain region of the semiconductor layer forming a p-channel TFT in a driver circuit portion and a region in the periphery thereof.

The second doping step is performed by an ion doping method under the condition where the dose amount is $5 \times 10^{14}/cm^2$ to $5 \times 10^{15}/cm^2$ and the accelerating voltage is 50 kV to 100 kV. Through the second doping step, a source region and a drain region of an n-channel TFT are formed. Note that the accelerating voltage of the second step is set lower than that of the first doping step.

Then, after removing the mask, a mask of a resist is newly formed, and a third doping step for doping the semiconductor layer with an impurity element imparting p-type conductivity (typically, boron) at high concentration is performed. The mask is provided to protect a source region and a drain region of the semiconductor layer forming an n-channel TFT in a pixel portion and a region in the periphery thereof, and a source region and a drain region of the semiconductor layer forming an n-channel TFT in a driver circuit portion and a region in the periphery thereof. Through the third doping step, a source region and a drain region of the p-channel TFT are formed.

Subsequently, the resist mask is removed. Through the above steps, an impurity region having n-type or p-type conductivity is formed in each semiconductor layer.

Next, after forming an insulating film containing hydrogen by an LPCVD method, a plasma CVD method, or the like, the impurity element added to the semiconductor layer is activated and hydrogenated. As the insulating film containing hydrogen, a silicon nitride oxide film (SiNO film) obtained by a PCVD method is used. Here, a thickness of the insulating film containing hydrogen is set to 50 nm to 200 nm. Note that the insulating film containing hydrogen is a first layer of an interlayer insulating film and contains silicon oxide.

Then, an inorganic insulating film is formed as a second layer of the interlayer insulating film by a sputtering method, an LPCVD method, a plasma CVD method, or the like. As the inorganic insulating film, a single-layer structure or a stacked layer structure of an insulating film such as a silicon oxide film, a silicon nitride film, or a silicon oxynitride film is used. Here, a thickness of the inorganic insulating film is set to 600 nm to 800 nm.

Next, a mask of a resist is formed using a photomask, and contact holes are formed by selectively etching the insulating film. Then, the mask made of a resist is removed.

After stacking metal films by a sputtering method, a mask of a resist is formed using a photomask, and the stacked metal films are selectively etched to form an electrode functioning as a source electrode or a drain electrode of a TFT. Note that the stacked metal films are continuously formed in the same metal sputtering apparatus. Then, the mask made of a resist is removed.

Through the above steps, top-gate TFTs 636, 637, 638, and 639 each including a polysilicon film as an active layer can be manufactured over the same substrate.

Note that the TFT 638 provided in the pixel portion is an n-channel TFT including a plurality of channel formation regions in one TFT. The TFT 638 is a double-gate TFT. The TFT 638 includes low-concentration impurity regions on both sides of a channel formation region. Each low-concentration impurity region includes a region overlapped with a gate electrode ($L_{ov}$ region) and a region which is not overlapped with the gate electrode ($L_{off}$ region). In the pixel portion, the TFT 639 electrically connected to a light emitting element to be formed later is provided. Here, in order to reduce off current, the TFT 639 is described as a double-gate p-channel TFT; however, there is no particular limitation. The TFT 639 may be a single-gate TFT.

In addition, the TFT 636 provided in the driver circuit portion is an n-channel TFT including low-concentration impurity regions ($L_{ov}$ regions) on both sides of a channel formation region. Each low-concentration impurity region is overlapped with the gate electrode in a self-aligned manner. The TFT 637 is a p-channel TFT including impurity regions having the same width on both a source side and a drain side. Both of the TFTs are single-gate TFTs. In the driver circuit portion, a CMOS circuit can be formed by complementarily connecting the TFTs 636 and 637 to each other, and various kinds of circuits can be realized. If necessary, a multi-gate TFT can be employed.

Next, a first electrode 623, that is, an anode (or a cathode) of an organic light emitting element is formed. The first electrode 623 may be formed using a single-layer film or a stacked-layer film of a material having a high work function such as an element selected from Ni, W, Cr, Pt, Zn, Sn, In, and Mo or an alloy material containing the element as a main component such as TiN, $TiSi_xN_y$, $WSi_x$, $WN_x$, $WSi_xN_y$, or NbN with a total thickness of 100 nm to 800 nm.

Specifically, a transparent conductive film formed of a light-transmitting conductive material may be used as the first electrode 623. Indium oxide containing tungsten oxide, indium zinc oxide containing tungsten oxide, indium oxide containing titanium oxide, indium tin oxide containing titanium oxide, or the like can be used. It is needless to say that indium tin oxide (ITO), indium zinc oxide (IZO), indium tin oxide to which silicon oxide is added (ITSO), or the like can also be used.

An example of a composition ratio of each light-transmitting conductive material is described. In indium oxide containing tungsten oxide, the composition ratio of tungsten oxide may be 1.0 wt % and that of indium oxide may be 99.0 wt %. In indium zinc oxide containing tungsten oxide, the composition ratio of tungsten oxide may be 1.0 wt %, that of zinc oxide may be 0.5 wt %, and that of indium oxide may be 98.5 wt %. In indium oxide containing titanium oxide, the composition ratio of titanium oxide may be 1.0 wt % to 5.0 wt % and that of indium oxide may be 99.0 wt % to 95.0 wt %. In indium tin oxide (ITO), the composition ratio of tin oxide may be 10.0 wt % and that of indium oxide may be 90.0 wt %. In indium zinc oxide (IZO), the composition ratio of zinc oxide may be 10.7 wt % and that of indium oxide may be 89.3 wt %. In indium tin oxide containing titanium oxide, the composition ratio of titanium oxide may be 5.0 wt %, that of tin oxide may be 10.0 wt %, and that of indium oxide may be 85.0 wt %. The composition ratios described above are just examples, and a composition ratio may be set appropriately.

Note that a second interlayer insulating film of an inorganic insulating film may be formed with a thickness of 100 nm to 150 nm after forming the electrode functioning as a source electrode or a drain electrode of the TFT, and the first electrode 623 may be formed after forming a contact hole reaching the TFT 639. The second interlayer insulating film may be formed using a single layer or two or more layers of an inorganic insulating film such as a silicon oxide film, a silicon nitride film, or a silicon oxynitride film. In addition, the inorganic insulating film may be formed using a sputtering method, an LPCVD method, a plasma CVD method, or the like. The second interlayer insulating film may be formed with a thickness of 50 nm to 500 nm (preferably, 100 nm to 300 nm). The formation of the second interlayer insulating film can prevent the TFT, the wire, or the like in the driver circuit portion from being exposed and can protect the same.

Then, an insulating film obtained by a coating method (for example, an organic resin film) is patterned to form an insulator 629 (referred to as a bank, a partition wall, a barrier, an embankment, or the like) covering an end portion of the first electrode 623. Note that the insulator 629 may also be formed only by light exposure and development using a photosensitive material without limitation to patterning using a mask.

Next, a layer 624 containing an organic compound is formed by an evaporation method or a coating method.

The layer 624 containing an organic compound is a stacked layer, and a buffer layer may be used as one layer of the layer 624 containing an organic compound. The buffer layer is formed using a composite material containing an organic compound and an inorganic compound, and the inorganic compound exhibits an electron-accepting property with respect to the organic compound. The buffer layer is formed using a composite material containing an organic compound and an inorganic compound, and the inorganic compound is one or a plurality of titanium oxide, zirconium oxide, hafnium oxide, vanadium oxide, niobium oxide, tantalum oxide, chromium oxide, molybdenum oxide, tungsten oxide, manganese oxide, and rhenium oxide. The buffer layer is formed using a composite material containing an organic compound having a hole-transporting property and an inorganic compound.

For example, it is preferable to provide a stacked layer containing an organic compound (stacked layer of the buffer layer and an organic compound layer) between the first electrode 623 and a second electrode. The buffer layer is a composite layer containing metal oxide (such as molybdenum oxide, tungsten oxide, or rhenium oxide) and an organic compound. The organic compound is a material having a hole-transporting property, such as 4,4'-bis[N-(3-methylphenyl)-N-phenylamino]biphenyl (abbr.: TPD), 4,4'-bis[N-(1-naphthyl)-N-phenylamino]biphenyl (abbr.: α-NPD), or 4,4'-bis{N-[4-(N,N-di-m-tolylamino)phenyl]-N-phenylamino} biphenyl (abbr.: DNTPD). An EL layer is provided over the buffer layer, and the EL layer can be formed using, for example, tris(8-quinolinolato)aluminum (abbr.: $Alq_3$), tris(4-methyl-8-quinolinolato)aluminum (abbr.: $Almq_3$), or α-NPD. In addition, the EL layer may contain a dopant material, and for example, N,N'-dimethylquinacridone (abbr.: DMQd), coumarin 6, rubrene, or the like can be used. The stacked layer containing an organic compound provided between the first electrode and the second electrode may be formed by an evaporation method such as a resistance heating method.

By adjusting the thickness of the buffer layer, a distance between the first electrode and the organic compound layer can be controlled, and thus, light-emitting efficiency can be improved. By adjusting the thickness of the buffer layer, an excellent image with a clear light-emission color of each light emitting element can be displayed and a light emitting device with low power consumption can be achieved.

Next, a second electrode 625, that is, a cathode (or an anode) of the organic light emitting element is formed. As the second electrode 625, an alloy such as MgAg, MgIn, or AlLi, or a transparent conductive film (such as ITO) is used.

Then, a protective layer 626 is formed by an evaporation method or a sputtering method. The protective layer 626 protects the second electrode 625. When light emission of the light emitting element is extracted through the protective layer 626, a transparent material is preferably used. If not necessary, the protective layer 626 is not required to be provided.

Subsequently, the light emitting element is sealed by attaching a sealing substrate 633 with a sealing material 628. In other words, a display region is surrounded by the sealing material, and the light emitting display device is sealed with a pair of substrates. The interlayer insulating film of the TFT is provided over the entire surface of the substrate. Therefore, when a pattern of the sealing material is drawn inside the periphery of the interlayer insulating film, moisture or an impurity may enter from a part of the interlayer insulating film that is located outside the pattern of the sealing material. Thus, the periphery of the insulating film that is used as the interlayer insulating film of the TFT is provided inside the pattern of the sealing material, preferably, overlapped with the pattern of the sealing material so that the sealing material covers an end portion of the insulating film. Note that a region surrounded by the sealing material 628 is filled with a filler 627. Alternatively, the region surrounded by the sealing material 628 is filled with a dry inert gas.

Finally, an FPC 632 is attached to a terminal electrode by a known method with an anisotropic conductive film 631. A cross-sectional view at this stage is shown in FIG. 5. As for the terminal electrode, a transparent conductive film that is obtained in the same step as the first electrode 623 is preferably used as an outermost layer and is formed over a terminal electrode that is formed at the same time as a gate wire.

Figure 6:
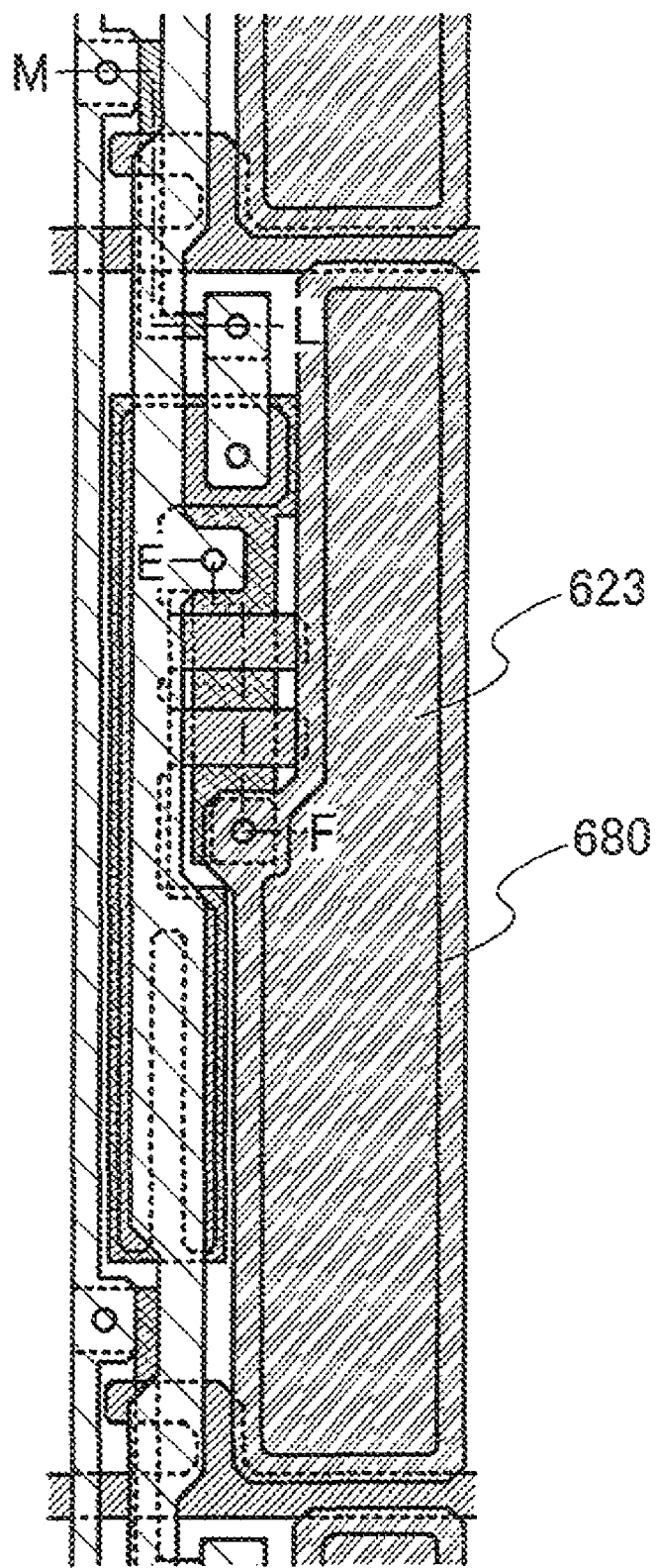
FIG. 6 is a top view of a pixel portion (Embodiment Mode 5).

FIG. 6 shows a top view of the pixel portion, and a cross-section taken along a chain line E-F in FIG. 6 corresponds to a cross-sectional structure of the p-channel TFT 639 in the pixel portion of FIG. 5. In addition, a cross-section taken along a chain line M-L in FIG. 6 corresponds to a cross-sectional structure of the n-channel TFT 638 in the pixel portion of FIG. 5. Note that a solid line denoted by reference numeral 680 in FIG. 6 represents the edge of the insulator 629. Note that only the second conductive layer is shown in FIG. 6 and the first conductive layer is not shown. The electrode functioning as a source electrode or a drain electrode of each of the n-channel TFT 638 and the p-channel TFT 639 in the pixel portion may be arranged so as to overlap the semiconductor layer, or may be arranged so that only a necessary portion overlaps the semiconductor layer when parasitic capacitance is desired to be reduced.

Through the above steps, the pixel portion, the driver circuit portion, and the terminal portion can be formed over the same substrate.

In this embodiment mode, the TFT in the pixel portion is formed to have a double-gate structure to reduce off current, and the TFT of Embodiment Mode 2 is used as each of the TFTs in the pixel portion and the driver circuit portion.

In addition, in the light emitting device, a light emitting display surface may be provided on one side or both sides. When the first electrode 623 and the second electrode 625 are both formed by using a transparent conductive film, light of the light emitting element is extracted to both sides through the substrate 610 and the sealing substrate 633. In this case, a transparent material is preferably used for the sealing substrate 633 and the filler 627.

When the second electrode 625 is formed of a metal film and the first electrode 623 is formed of a transparent conductive film, a structure in which light of the light emitting element is extracted to one side through only the substrate 610, that is, a bottom emission structure can be obtained. In this case, a transparent material is not necessarily used for the sealing substrate 633 and the filler 627.

When the first electrode 623 is formed of a metal film and the second electrode 625 is formed of a transparent conductive film, a structure in which light of the light emitting element is extracted to one side through only the sealing substrate 633, that is, a top emission structure can be obtained. In this case, a transparent material is not necessarily used for the substrate 610.

Materials for the first electrode 623 and the second electrode 625 are required to be selected considering a work function. Each of the first electrode 623 and the second electrode 625 can serve as an anode or a cathode depending on a pixel structure. When the polarity of a driver TFT is a p-channel type, the first electrode is preferably an anode and the second electrode is preferably a cathode. When the polarity of the driver TFT is an n-channel type, the first electrode is preferably a cathode and the second electrode is preferably an anode.

Figure 7:
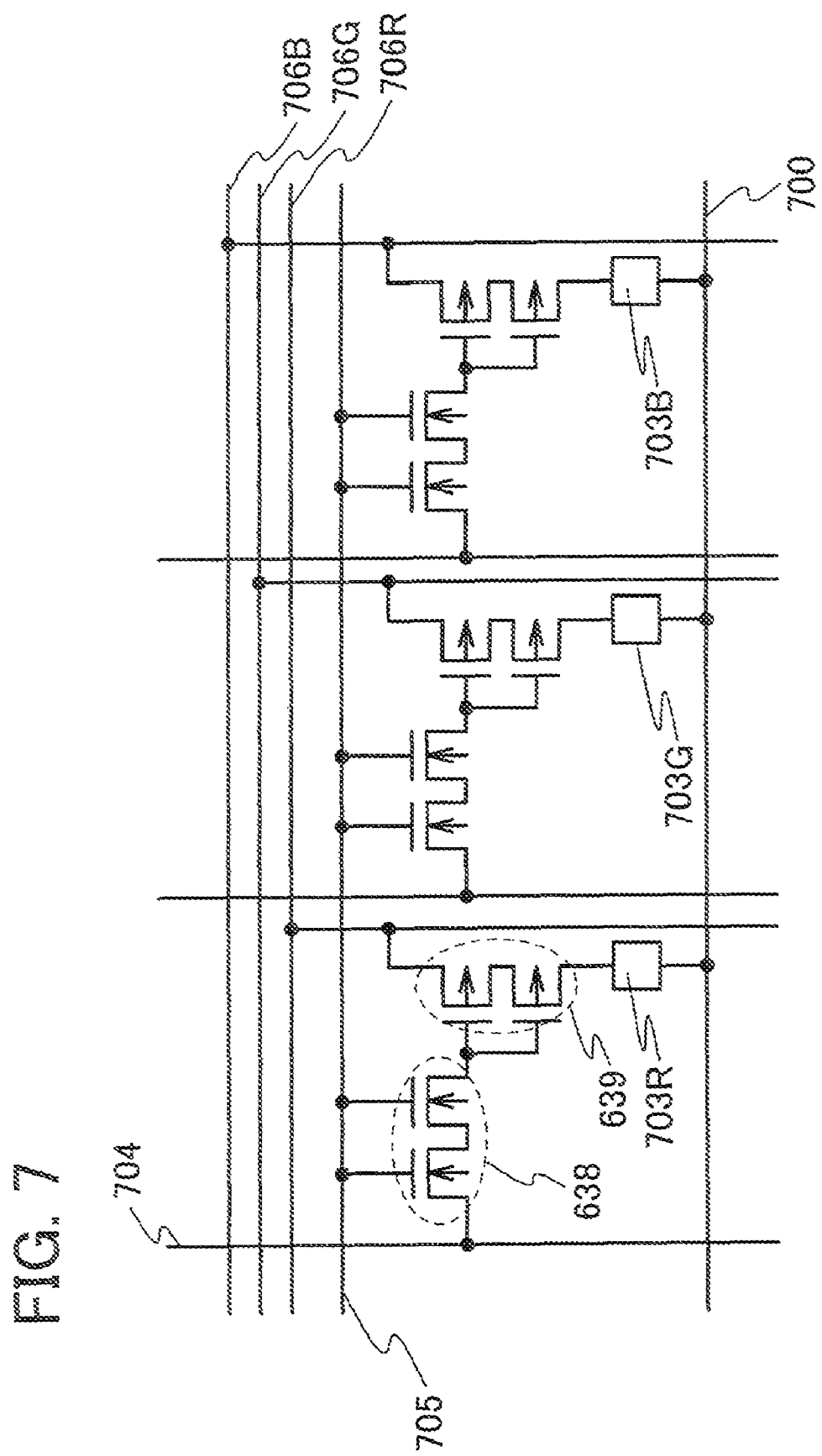
FIG. 7 is a diagram showing an equivalent circuit in a pixel portion (Embodiment Mode 5).

FIG. 7 shows an equivalent circuit diagram in the pixel portion of this embodiment mode in the case where full color display is performed. A TFT 638 in FIG. 7 corresponds to the switching TFT 638 in FIG. 5, and a TFT 639 corresponds to the current control TFT 639. In FIG. 7, reference numeral 704 denotes a source wire and 705 denotes a gate wire. In a pixel displaying red, an OLED 703R which emits red light is connected to a drain region of the current control TFT 639, and an anode side power supply line (R) 706R is provided in a source region. In addition, the OLED 703R is provided with a cathode side power supply line 700. In the pixel displaying green, an OLED 703G which emits green light is connected to a drain region of the current control TFT, and an anode side power supply line (G) 706G is provided in a source region. In the pixel displaying blue, an OLED 703B which emits blue light is connected to a drain region of the current control TFT, and an anode side power supply line (B) 706B is provided in a source region. Different voltages are applied to pixels emitting different colors in accordance with EL materials.

In the light emitting device, a driving method for image display is not particularly limited, and for example, a dot sequential driving method, a line sequential driving method, an area sequential driving method, or the like may be used. Typically, the line sequential driving method is used, and a time division gray scale driving method or an area gray scale driving method may be appropriately used. Further, a video signal inputted to the source line of the light emitting device may be an analog signal or a digital signal. The driver circuit and the like may be appropriately designed in accordance with the video signal.

Furthermore, in a light emitting device using a digital video signal, a video signal inputted to a pixel is classified into a video signal at a constant voltage (CV) and a video signal at a constant current (CC). The video signal at a constant voltage (CV) is further classified into a video signal with a constant voltage applied to a light emitting element (CVCV), and a video signal with a constant current applied to a light emitting element (CVCC). In addition, the video signal at a constant current (CC) is classified into a video signal with a constant voltage applied to a light emitting element (CCCV), and a video signal with a constant current applied to a light emitting element (CCCC).

Further, in the light emitting device, a protective circuit (such as a protective diode) for preventing electrostatic discharge damage may be provided.

Here, the display device is described as an active matrix light-emitting device as an example; however, the present invention can also be applied to an active matrix liquid crystal display device. Also in the case of applying the present invention to an active matrix liquid crystal display device, each gate electrode and each wire arranged in the pixel portion and the driver circuit portion can be formed using the light exposure mask including a semi-transmissive portion having a light intensity reduction function described in Embodiment Mode 1 or 2. Accordingly, the number of masks can be reduced, and precise alignment in manufacturing a GOLD structure becomes unnecessary. Then, many steps such as substrate cleaning, resist material application, pre-bake, light exposure, development, and post-bake can be eliminated, and processing time can be shortened.

This embodiment mode can be freely combined with any of Embodiment Modes 1 to 4.

Embodiment Mode 6

Embodiment Modes 2 to 5 describe examples in each of which a light exposure mask including a semi-transmissive portion having a light intensity reduction function is used for forming a gate electrode and a wire; however, a light exposure mask including a semi-transmissive portion having a light intensity reduction function may be used for contact opening formation in an interlayer insulating film.

Figure 8A:
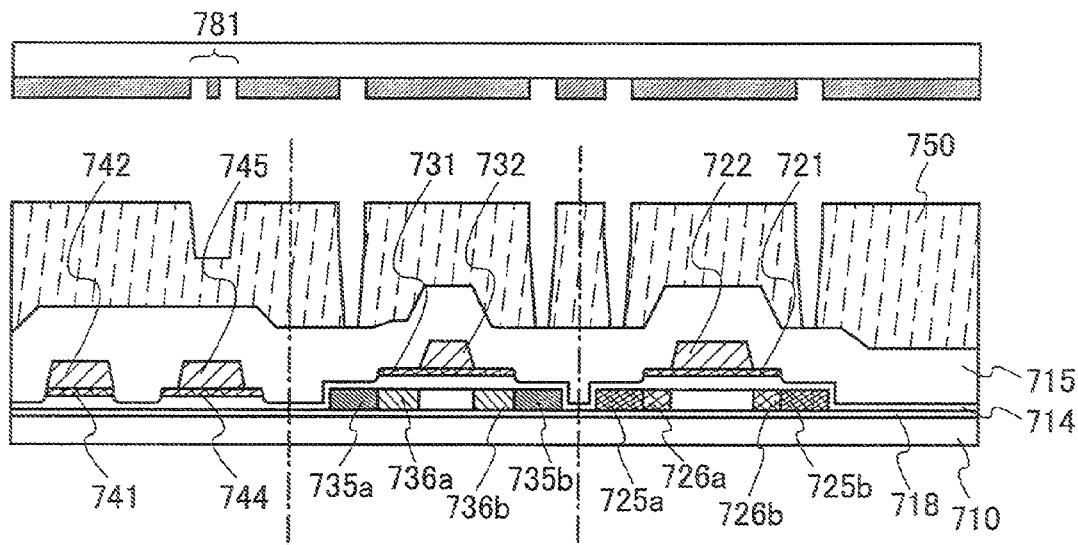
FIGS. 8A to 8C are cross-sectional views showing a manufacturing process for a light emitting device (Embodiment Mode 6).
Figure 8B:
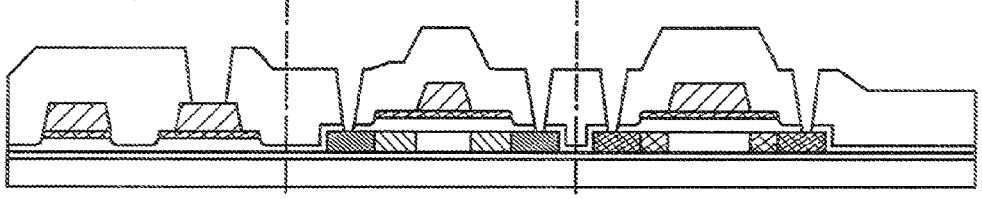
Figure 8C:
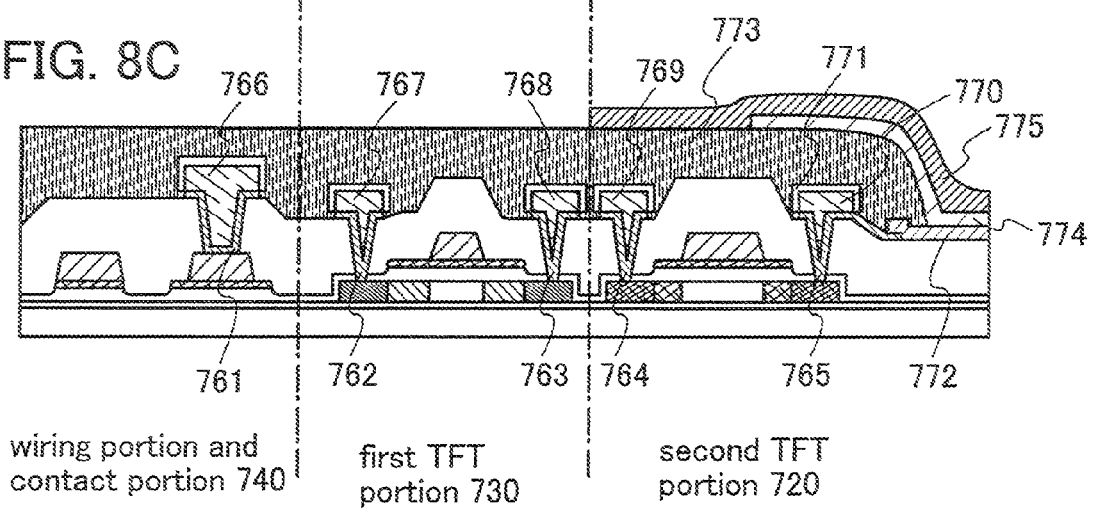

This embodiment mode explains an example in which a light exposure mask including a semi-transmissive portion having a light intensity reduction function is used for contact opening formation in an interlayer insulating film and for pattern formation of a connection wire, with reference to FIGS. 8A to 8C.

In accordance with Embodiment Mode 2, after forming a base insulating film 718 over a substrate 710 having an insulating surface, a semiconductor layer and a gate insulating film 714 covering the semiconductor layer are formed. Then, a first conductive film and a second conductive film are stacked. A resist pattern is formed using a light exposure mask including a semi-transmissive portion having a light intensity reduction function, and then the first conductive film and the second conductive film are etched to form a gate electrode and a wire.

Here, similarly to Embodiment Mode 2, a first conductive layer 731 and a second conductive layer 732 are formed in a first TFT portion 730, and a first conductive layer 721 and a second conductive layer 722 are formed in a second TFT portion 720. Note that electrode structures thereof are explained in Embodiment Mode 2; therefore, detailed explanation thereof is omitted here.

In addition, as shown in FIG. 8A, in a wiring portion and a contact portion 740, a first conductive layer 744 is wider than a second conductive layer 745 in a portion for contact with an upper wire. Thus, even when misalignment of a wire with an upper layer is caused, the wire can be in contact also with the first conductive layer. Further, in a portion other than the portion for contact, end portions of a first conductive layer 741 and a second conductive layer 742 correspond to each other.

Next, after forming a resist pattern to cover the second TFT portion 720, an impurity element imparting n-type conductivity is added to the semiconductor layer. By adding the impurity element imparting n-type conductivity, a drain region 735a, a source region 735b, a first LDD region 736a, and a second LDD region 736b are formed in a self-aligned manner. Note that the addition of the impurity element imparting n-type conductivity may be performed by single doping treatment or by plural times of doping treatment.

As shown in FIG. 8A, the first LDD region 736a and the second LDD region 736b have approximately the same width in a channel length direction. In addition, the first LDD region 736a and the second LDD region 736b are overlapped with the first conductive layer 731 with the gate insulating film 714 interposed therebetween.

Subsequently, after removing the resist pattern, a resist pattern is newly formed to cover the first TFT portion 730. Then, an impurity element imparting p-type conductivity is added to the semiconductor layer. By adding the impurity element imparting p-type conductivity, a drain region 725a, a source region 725b, a third LDD region 726a, and a fourth LDD region 726b are formed in a self-aligned manner.

As shown in FIG. 8A, the third LDD region 726a and the fourth LDD region 726b have approximately the same width in a channel length direction. In addition, the third LDD region 726a and the fourth LDD region 726b are overlapped with the first conductive layer 721 with the gate insulating film 714 interposed therebetween.

The order of adding the impurity elements is not particularly limited. For example, the impurity element imparting p-type conductivity may be added to the semiconductor layer first, and then the impurity element imparting n-type conductivity may be added to the semiconductor layer.

Subsequently, after activating the impurity elements added to the semiconductor layer, an interlayer insulating film 715 is formed and then coated with a resist film.

Subsequently, the resist film is exposed to light and developed using a light exposure mask including a semi-transmissive portion 781 having a light intensity reduction function shown in FIG. 8A, thereby forming a resist pattern 750 shown in FIG. 8A. The resist pattern 750 is a mask for forming an opening in the lower insulating film, and due to the light exposure mask including the transmissive portion 781 having a light intensity reduction function, openings with different depths are formed. In the wiring portion and the contact portion 740, only one layer that is the interlayer insulating film 715 is provided over the second conductive layer 745; therefore, a shallow opening is provided over the second conductive layer 745. In contrast, in each of the first TFT portion 730 and the second TFT portion 720, two layers that are the interlayer insulating film 715 and the gate insulating film 714 are provided over each of the source region and the drain region; therefore, deep openings are provided over the source region and the drain region. Conditions (such as shape, size, and arrangement of lines and spaces) of the semi-transmissive portion 781 of the light exposure mask used herein can be different from those of the light exposure mask described in Embodiment Mode 1 or the like. In the present invention, the light exposure mask with the conditions described in Embodiment Mode 1 or the like and a light exposure mask with different conditions can be used in combination.

Then, etching is performed using the resist pattern 750 to form openings in the interlayer insulating film 715 and the gate insulating film 714. According to this etching, openings are formed in the interlayer insulating film 715 and the gate insulating film 714 while etching the resist pattern 750, so that openings with different depths can be formed.

Then, the resist pattern is removed. FIG. 8B shows a cross-sectional view at this stage.

Next, a stacked layer of a third conductive layer (such as a titanium nitride film) and a fourth conductive layer (such as an aluminum film) is formed. Patterning is performed to form a third conductive layer 761 as a connection wire, a fourth conductive layer 766 as a connection wire, a third conductive layer 762 as a drain wire, a fourth conductive layer 767 as a drain wire, a third conductive layer 763 as a source wire, and a fourth conductive layer 768 as a source wire. In addition, in the second TFT portion, a third conductive layer 765 as a connection electrode, a fourth conductive layer 770 as a connection electrode, a third conductive layer 769 as a source electrode, and a fourth conductive layer 764 as a source electrode are formed. Here, the light exposure mask including a semi-transmissive portion having a light intensity reduction function is used for pattern formation of the connection electrode. The third conductive layer 765 as the connection electrode has a larger area than that of the fourth conductive layer 770 as the connection electrode.

Subsequently, plasma treatment is performed to oxidize the fourth conductive layers, so that oxide films 771 are formed on the surface of the fourth conductive layers.

Note that when the fourth conductive layers are oxidized by plasma treatment, the plasma treatment is performed under an oxygen atmosphere (for example, under an atmosphere including oxygen ($O_2$) and a rare gas (containing at least one of He, Ne, Ar, Kr, and Xe), under an atmosphere including oxygen, hydrogen ($H_2$), and a rare gas, or under an atmosphere including dinitrogen monoxide and a rare gas). On the other hand, when a film is nitrided by plasma treatment, the plasma treatment is performed under a nitrogen atmosphere (for example, under an atmosphere including nitrogen ($N_2$) and a rare gas (containing at least one of He, Ne, Ar, Kr, and Xe), under an atmosphere including nitrogen, hydrogen, and a rare gas, or under an atmosphere including $NH_3$ and a rare gas). As the rare gas, for example, Ar can be used. Further, a mixed gas of Ar and Kr may be used. Therefore, an insulating film formed by plasma treatment contains a rare gas (containing at least one of He, Ne, Ar, Kr, and Xe) used for the plasma treatment, and the insulating film contains Ar in the case of using Ar.

When plasma treatment is performed to the fourth conductive layers, the plasma treatment is performed under an atmosphere of the above described gas with an electron density of $1 \times 10^{11}$ cm$^{-3}$ or higher and an electron temperature of plasma of 1.5 eV or lower. More specifically, plasma treatment is performed with an electron density of $1 \times 10^{11}$ cm$^{-3}$ to $1 \times 10^{13}$ cm$^{-3}$ and an electron temperature of plasma of 0.5 eV to 1.5 eV. Since electron density of plasma is high and electron temperature in the vicinity of an object to be treated (here, the fourth conductive layers) formed over the substrate is low, damage by plasma to the object to be treated can be prevented. Further, since an electron density of plasma is high, $1 \times 10^{11}$ cm$^{-3}$ or higher, the oxide film or the nitride film, which is formed by oxidizing or nitriding the object to be treated using the plasma treatment, has excellent uniformity in thickness or the like and dense film quality as compared with a film formed by a CVD method, a sputtering method, or the like. Moreover, since an electron temperature of plasma is low, 1.5 eV or lower, oxidizing or nitriding treatment can be performed at a lower temperature than that of conventional plasma treatment or thermal oxidation method. For example, oxidizing or nitriding treatment can be sufficiently performed even when performing plasma treatment at a temperature lower than a strain point of a glass substrate by 100° C. or more. Note that a high frequency wave such as a microwave (2.45 GHz) can be used as a frequency for forming plasma.

Then, one electrode 772 included in a light emitting element is formed. This electrode 772 is arranged so as to partially overlap the third conductive layer 765 as the connection electrode, and is electrically connected to the TFT. The electrode 772 may be formed using a single-layer film or a stacked-layer film of a material having a high work function such as an element selected from Ni, W, Cr, Pt, Zn, Sn, In, and Mo, or an alloy material containing the element as a main component such as TiN, TiSi$_x$N$_y$, WSi$_x$, WN$_x$, WSi$_x$N$_y$, or NbN to have a total thickness of 100 nm to 800 nm.

Then, an insulator 773 (referred to as a bank, a partition wall, a barrier, an embankment, or the like) covering an end portion of the electrode 772 included in the light emitting element is formed.

Subsequently, a layer 774 containing an organic compound is formed over the electrode 772 by an evaporation method or a coating method.

Next, the other electrode 775 included in the light emitting element is formed over the layer 774 containing an organic compound. The electrode 775 may be formed using an alloy such as MgAg, MgIn, or AlLi, or a transparent conductive film (such as ITO).

In this manner, in the second TFT portion 720, the light emitting element including the electrode 772, the layer 774 containing an organic compound, and the electrode 775 and a p-channel TFT which is connected to the light emitting element are formed. In the TFT which is connected to the light emitting element, LDD regions with the same width are preferably provided in order to reduce off current.

Further, as a TFT constituting a part of a buffer circuit of the driver circuit, an n-channel TFT shown in the first TFT portion 730 is preferably provided. The n-channel TFT shown in the first TFT portion 730 can relieve electric field intensity in the vicinity of the drain, and can thus prevent deterioration of a circuit.

This embodiment mode can be freely combined with any of Embodiment Modes 1 to 5.

Embodiment Mode 7

Here, an example of mounting an FPC or a driver IC on a light emitting display panel is described with reference to FIGS. 9A and 9B.

Figure 9A:
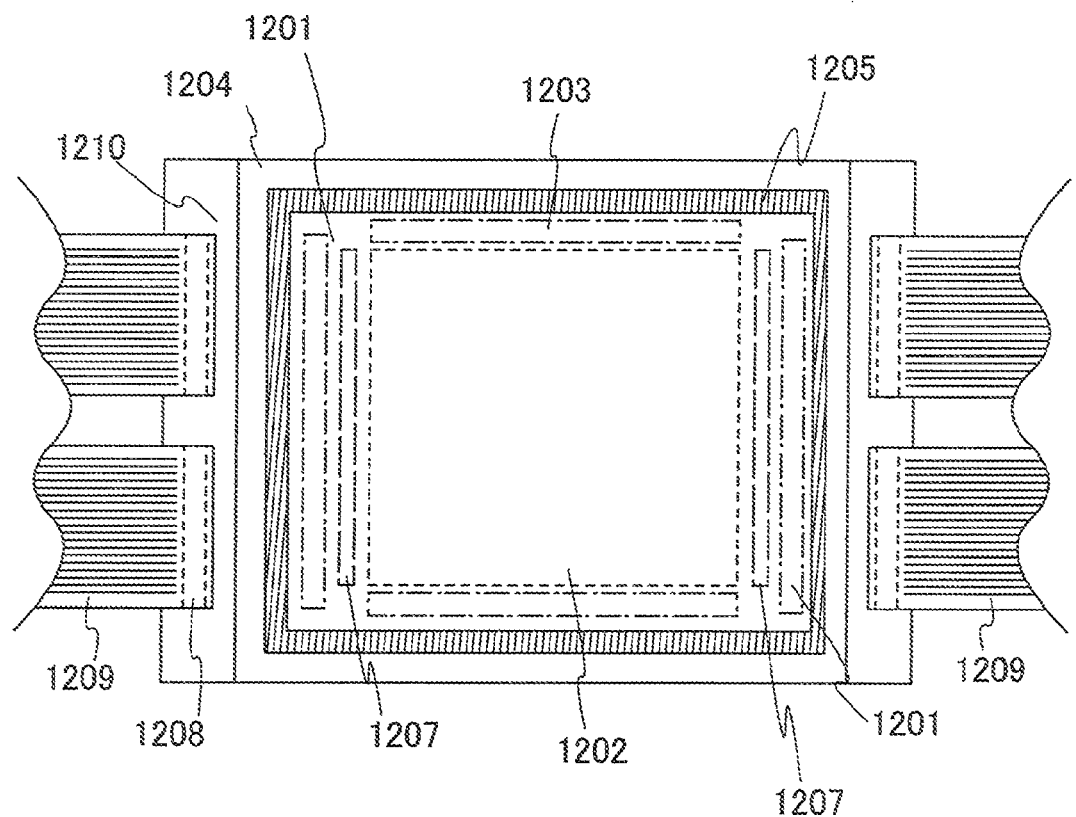
FIGS. 9A and 9B are diagrams showing examples of modules (Embodiment Mode 7).

FIG. 9A shows an example of a top view of a light emitting device in which FPCs 1209 are attached to four terminal portions 1208. A pixel portion 1202 including a light emitting element and a TFT, a gate driver circuit 1203 including a TFT, and a source driver circuit 1201 including a TFT are formed over a substrate 1210. An active layer of each TFT is formed of a semiconductor film having a crystalline structure, and these circuits are formed over the same substrate. Therefore, an EL display panel that realizes system-on-panel can be manufactured.

Note that the substrate 1210 is covered with a protective film except in a contact portion, and a base layer containing a substance having a photocatalytic function is formed over the protective film.

In addition, two connection regions 1207 provided so as to sandwich a pixel portion are provided so that a second electrode of the light emitting element is in contact with a wire in a lower layer. Note that a first electrode of the light emitting element is electrically connected to a TFT provided in the pixel portion.

A sealing substrate 1204 is fixed to the substrate 1210 with a sealing material 1205 surrounding the pixel portion and the driver circuit, and a filler material surrounded by the sealing material. A structure filled with a filler material containing a transparent drying agent may also be employed. Further, a drying agent may be provided in a region which is not overlapped with the pixel portion.

Figure 9B:
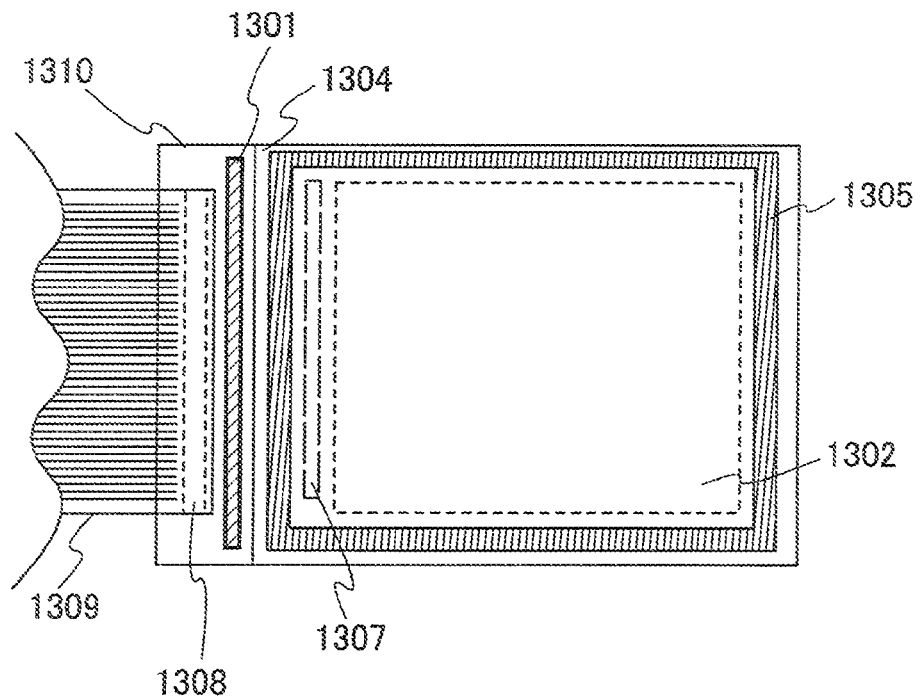

FIG. 9A shows an example suitable for a light emitting device having a relatively large size of an XGA class (for example, having a diagonal line of 4.3 inches) whereas FIG. 9B shows an example of employing a COG method which is suitable for a compact size with a narrower frame (for example, having a diagonal line of 1.5 inches).

In FIG. 9B, a driver IC 1301 is mounted over a substrate 1310, and an FPC 1309 is mounted over a terminal portion 1308 provided at an end of the driver IC. A plurality of driver ICs 1301 is preferably formed over a rectangular substrate having a side of 300 mm to 1000 mm or a side longer than 1000 mm for improvement in productivity. In other words, a plurality of circuit patterns each including a driver circuit portion and an input-output terminal as a unit may be formed over the substrate and the driver ICs may each be taken out by dividing lastly. In consideration of a side length of the pixel portion or a pixel pitch, the driver IC may be formed in a rectangular shape having a long side of 15 mm to 80 mm and a short side of 1 mm to 6 mm. Alternatively, the driver IC may be formed to have the same side length as that of the pixel portion, or that of adding a side length of the pixel portion to a side length of each driver circuit.

An advantage of the external dimension of the driver IC over an IC chip is the length of a long side. When a driver IC having a long side length of 15 mm to 80 mm is used, the number of the driver ICs necessary for being mounted in accordance with the pixel portion is smaller than that in the case of using an IC chip. Therefore, yield in manufacturing can be improved. When a driver IC is formed over a glass substrate, productivity is not decreased since there is no limitation on the shape of a substrate used as a mother body. This is a great advantage as compared with the case of taking the IC chip out of a circular silicon wafer.

Alternatively, a TAB method may be employed. In that case, a plurality of tapes may be attached and driver ICs may be mounted on the tapes. Similarly to the case of a COG method, a single driver IC may be mounted on a single tape. In this case, a metal piece or the like for fixing the driver IC may be attached together in terms of strength.

A connection region 1307 provided between the pixel portion 1302 and the driver IC 1301 is provided so that a second electrode of a light emitting element is in contact with a wire in a lower layer. Note that a first electrode of the light emitting element is electrically connected to a TFT provided in the pixel portion.

In addition, a sealing substrate 1304 is fixed to the substrate 1310 with a sealing material 1305 surrounding the pixel portion 1302, and a filler material surrounded by the sealing material.

When an amorphous semiconductor film is used as an active layer of each TFT in the pixel portion, it is difficult to form a driver circuit over the same substrate; thus, the structure of FIG. 9B is employed also for a large size.

An active matrix light emitting device is described as an example of a display device here, but it is needless to say that the present invention can also be applied to an active matrix liquid crystal display device. In the active matrix liquid crystal display device, pixel electrodes arranged in matrix are driven to form a display pattern on the screen. Specifically, voltage is applied between a selected pixel electrode and an opposite electrode corresponding to the pixel electrode, and thus, a liquid crystal layer between the pixel electrode provided over the element substrate and the opposite electrode provided over the opposite substrate is optically modulated. This optical modulation is recognized as a display pattern by an observer. The opposite substrate and the element substrate are arranged at an even interval and the space therebetween is filled with a liquid crystal material. As for the liquid crystal material, a method may be employed, by which the liquid crystal material is dropped under reduced pressure so that a bubble does not enter using the sealing material as a closed pattern and the substrates are attached to each other. Alternatively, a dip method (pumping method) may be employed, by which liquid crystal is injected using a capillary phenomenon after providing a seal pattern having an opening and attaching the TFT substrates.

The present invention can also be applied to a liquid crystal display device using a field sequential driving method in which not a color filter but a light shutter is used and backlight light sources for three colors of R, G, and B are flashed on and off at high speed.

Various electronic devices can be manufactured using the manufacturing method or the structure described in any one of Embodiment Modes 1 to 6, which implements the present invention as described above.

Embodiment Mode 8

As examples of semiconductor devices of the present invention and electronic devices, the following can be given: a camera such as a video camera or a digital camera, a goggle type display (head mounted display), a navigation system, a sound reproduction device (car audio component or the like), a computer, a game machine, a portable information terminal (a mobile computer, a mobile telephone, a mobile game machine, an electronic book, or the like), an image reproduction device equipped with a recording medium (specifically, a device which reproduces the recording medium such as a digital versatile disc (DVD) and which is equipped with a display for displaying the image), and the like. Specific examples of these electronic devices are shown in FIGS. 10A to 11.

Figure 10A:
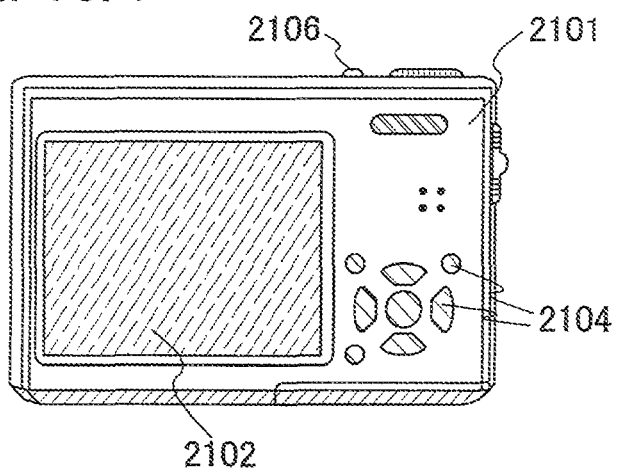
FIGS. 10A to 10E are diagrams showing examples of electronic devices (Embodiment Mode 8).
Figure 11:
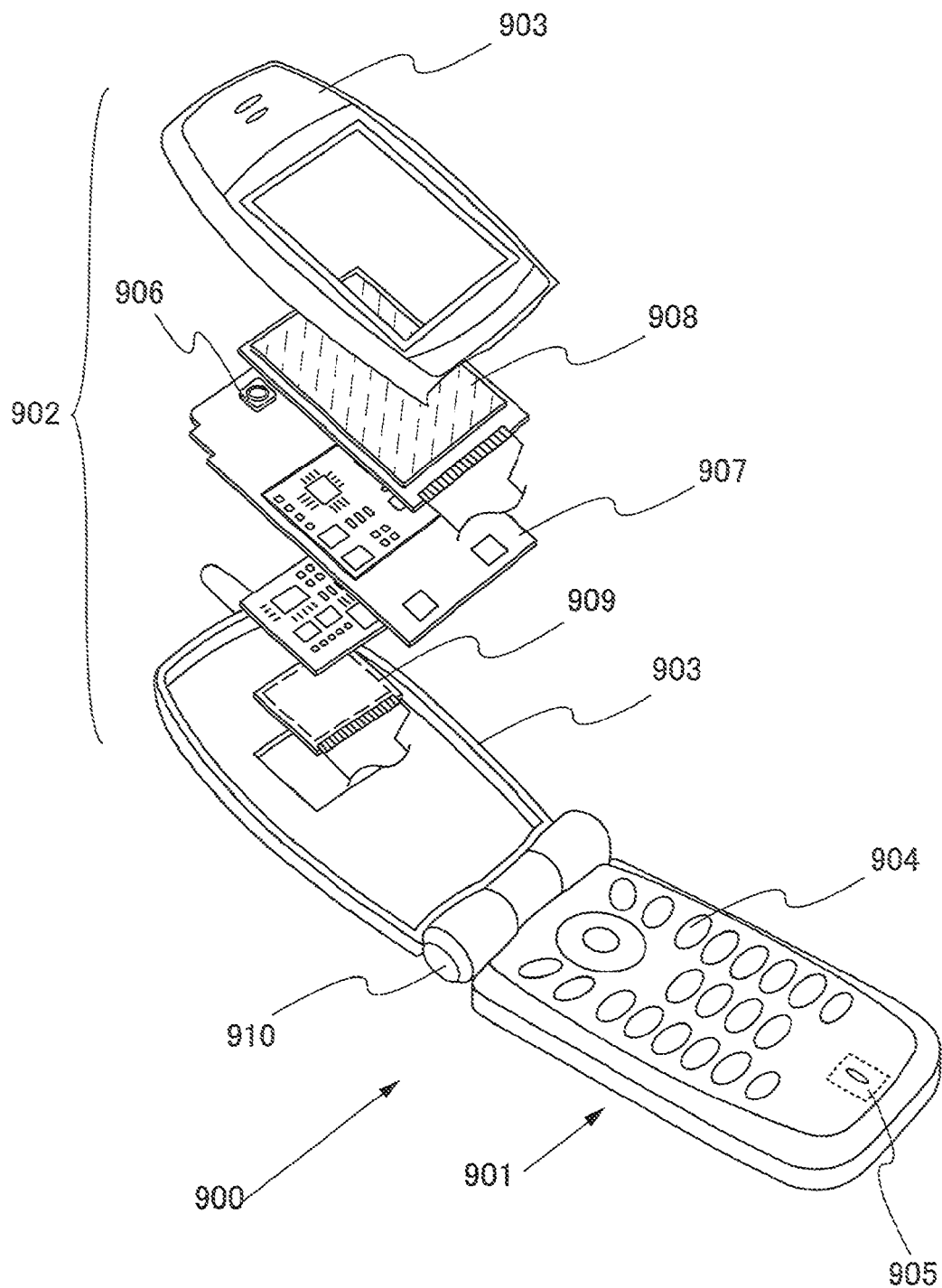
FIG. 11 is a diagram showing an example of an electronic device (Embodiment Mode 8).
Figure 12A:
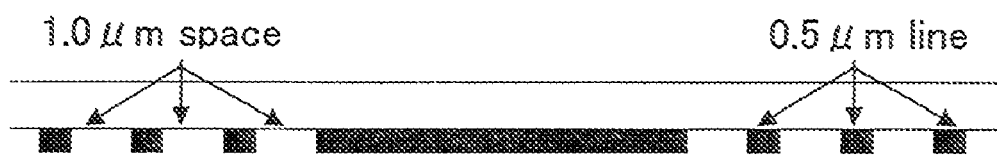
FIGS. 12A and 12B are a cross-sectional view of a light exposure mask and a cross-sectional photograph of a photoresist layer, respectively.
Figure 12B:
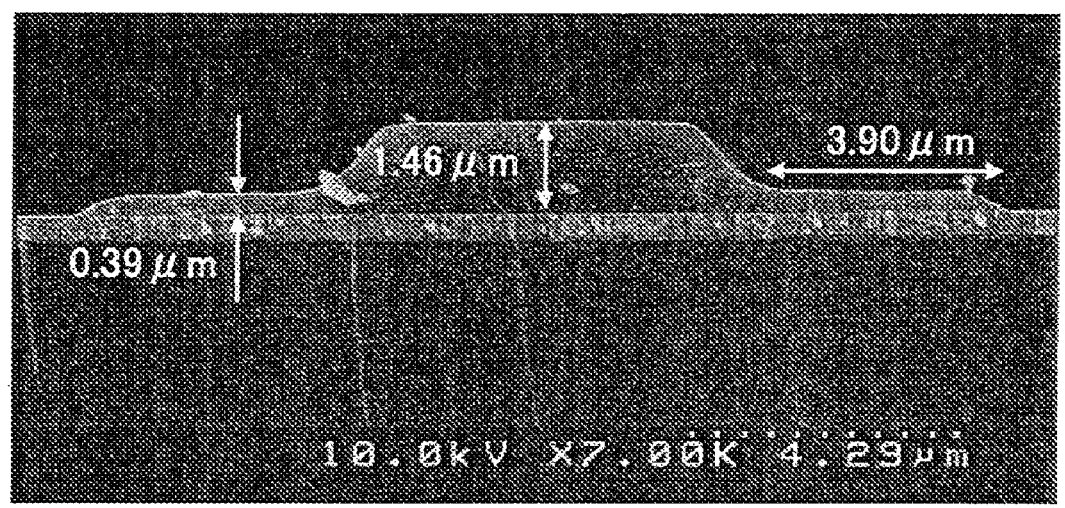
Figure 13A:
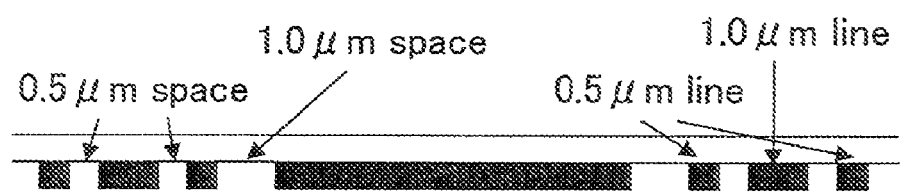
FIGS. 13A and 13B are a cross-sectional view of a light exposure mask and a cross-sectional photograph of a photoresist layer, respectively.
Figure 13B:
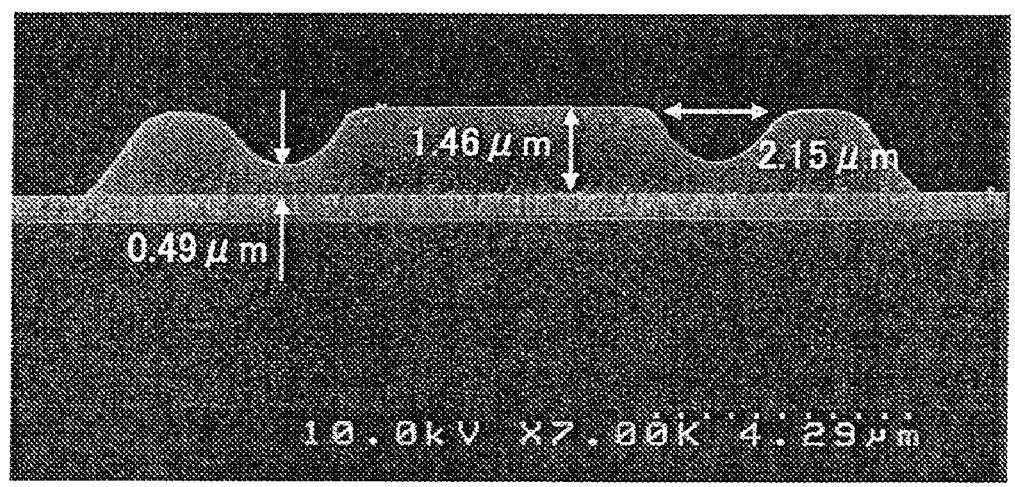

FIG. 10A shows a digital camera, which includes a main body 2101, a display portion 2102, an imaging portion, operation keys 2104, a shutter 2106, and the like. Note that FIG. 10A shows a view from the display portion 2102 side and the imaging portion is not shown. The present invention can realize a highly reliable digital camera having a high-definition display portion.

Figure 10B:
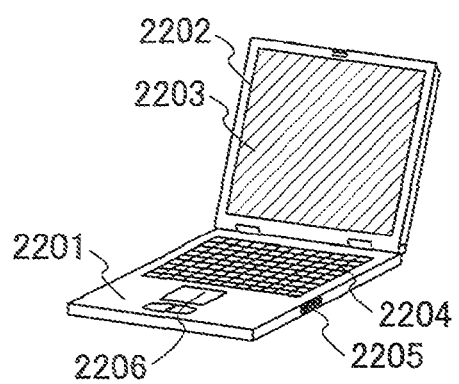

FIG. 10B shows a notebook personal computer, which includes a main body 2201, a chassis 2202, a display portion 2203, a keyboard 2204, an external connection port 2205, a pointing mouse 2206, and the like. The present invention can realize a highly reliable notebook personal computer having a high-definition display portion.

Figure 10C:
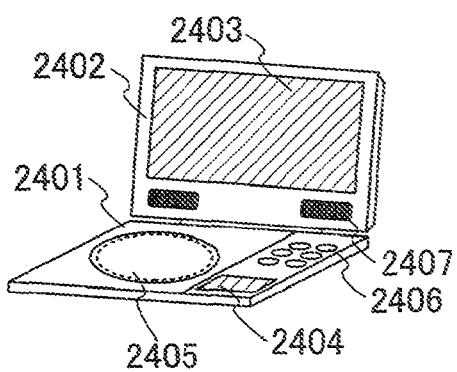

FIG. 10C shows a mobile image reproducing device equipped with a recording medium (specifically, a DVD reproducing device), which includes a main body 2401, a chassis 2402, a display portion A 2403, a display portion B 2404, a recording medium (such as a DVD) reading portion 2405, an operation key 2406, a speaker portion 2407, and the like. The display portion A 2403 mainly displays image information and the display portion B 2404 mainly displays character information. Note that the image reproducing device equipped with a recording medium includes a home-use game machine and the like. The present invention can realize a highly reliable image reproducing device having a high-definition display portion.

Figure 10D:
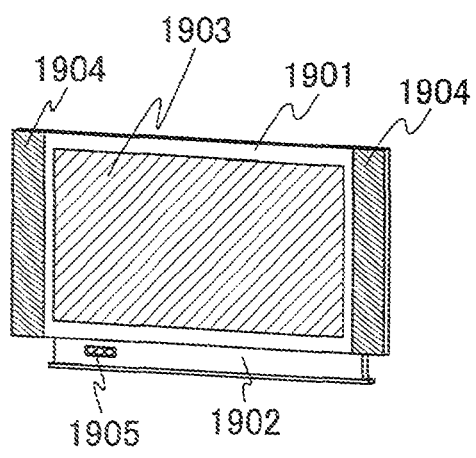

FIG. 10D shows a display device, which includes a chassis 1901, a support 1902, a display portion 1903, a speaker 1904, a video input terminal 1905, and the like. The display device is manufactured by using a thin film transistor formed by the manufacturing method described in the above embodiment mode for the display portion 1903 and a driver circuit. Note that the display device includes, in its category, a liquid crystal display device, a light emitting device, and the like, and specifically includes all kinds of display devices for displaying information, such as devices for a personal computer, for receiving TV broadcasting, for displaying an advertisement, and the like. The present invention can realize a highly reliable display device having a high-definition display portion, particularly, a large display device having a 22-inch to 50-inch large screen.

A thin film integrated circuit having a TFT of the present invention can also be used as a contactless thin film integrated circuit device (also referred to as a wireless IC tag or an RFID (Radio Frequency Identification) tag) when an antenna or the like is additionally formed. By attaching IC tags to various electronic devices, distribution channels of the electronic devices can be clarified.

Figure 10E:
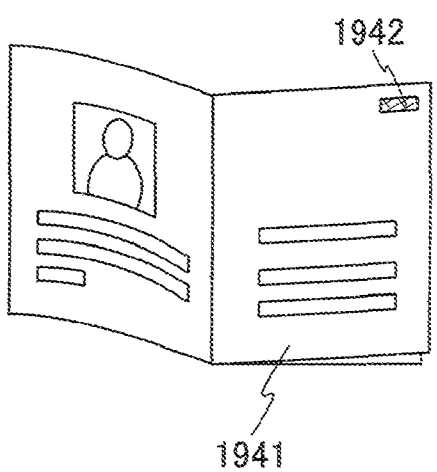

FIG. 10E shows a passport 1941 to which a wireless IC tag 1942 is attached. Alternatively, the wireless IC tag 1942 may be embedded in the passport 1941. Similarly, the wireless IC tag may be attached to or embedded in a driver's license, a credit card, a banknote, a coin, a certificate, a merchandise coupon, a ticket, a traveler's check (T/C), a health insurance card, a residence certificate, a family register, and the like. In this case, only information showing that this is an authentic one is inputted to the wireless IC tag, and an access right is set to prevent unauthorized reading or writing of information, which can be achieved by using the memory described in other embodiment modes. By using the memory as a tag as described above, an authentic one can be distinguished from a forged one. In addition, the wireless IC tag can also be used as a memory. Further, by providing the wireless IC tag in wrapping containers, recording media, personal belongings, food, clothing, commodities, electronic devices, and the like, efficiency of a system such as an inspection system can be improved.

In a mobile phone shown in FIG. 11, a main body (A) 901 including operation switches 904, a microphone 905, and the like is connected with a hinge 910 to a main body (B) 902 including a display panel (A) 908, a display panel (B) 909, a speaker 906, and the like so as to be openable and closeable. The display panel (A) 908 and the display panel (B) 909 are stored in a chassis 903 of the main body (B) 902 together with a circuit board 907. Pixel portions of the display panel (A) 908 and the display panel (B) 909 are placed so as to be visible through open windows formed in the chassis 903.

As for the display panel (A) 908 and the display panel (B) 909, the specification such as the number of pixels can be appropriately determined in accordance with functions of the mobile phone 900. For example, the display panel (A) 908 and the display panel (B) 909 can be combined as a main screen and a sub-screen, respectively.

The present invention can realize a highly reliable mobile phone having a high-definition display portion.

The mobile phone according to this embodiment mode can be modified in various modes depending on functions or applications thereof. For example, it may be a camera-equipped mobile phone by incorporating an imaging element in the hinge 910. Even when the operation switches 904, the display panel (A) 908, and the display panel (B) 909 are stored in one chassis, the above-described effect can be obtained. Further, a similar effect can be obtained when the structure of this embodiment mode is applied to an information display terminal provided with a plurality of display portions.

As described above, various electronic devices can be manufactured using the manufacturing method or the structure described in any one of Embodiment Modes 1 to 7, which implements the present invention.

Embodiment Mode 9

Figure 14A:
FIGS. 14A to 14C are a cross-sectional view of a light exposure mask, a cross-sectional photograph of a resist pattern, and a perspective observation photograph of a conductive stacked pattern, respectively.
Figure 14B:
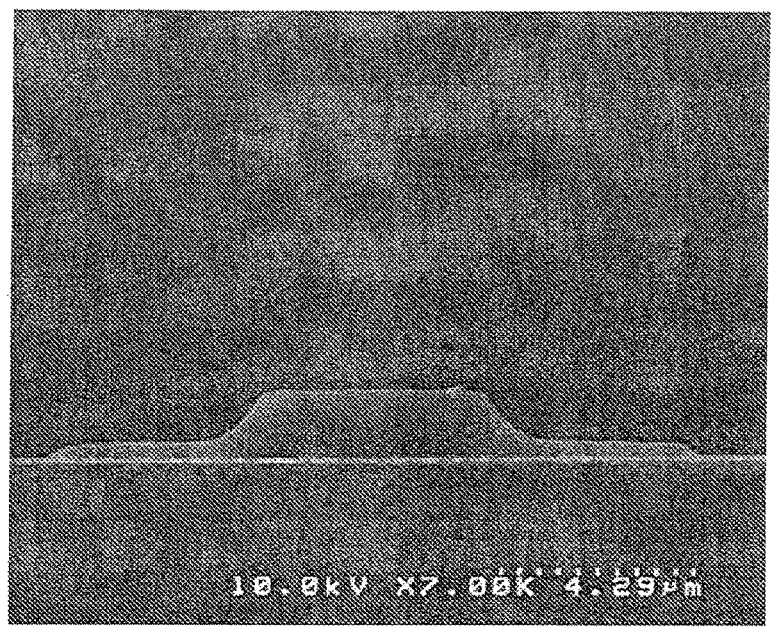
Figure 14C:
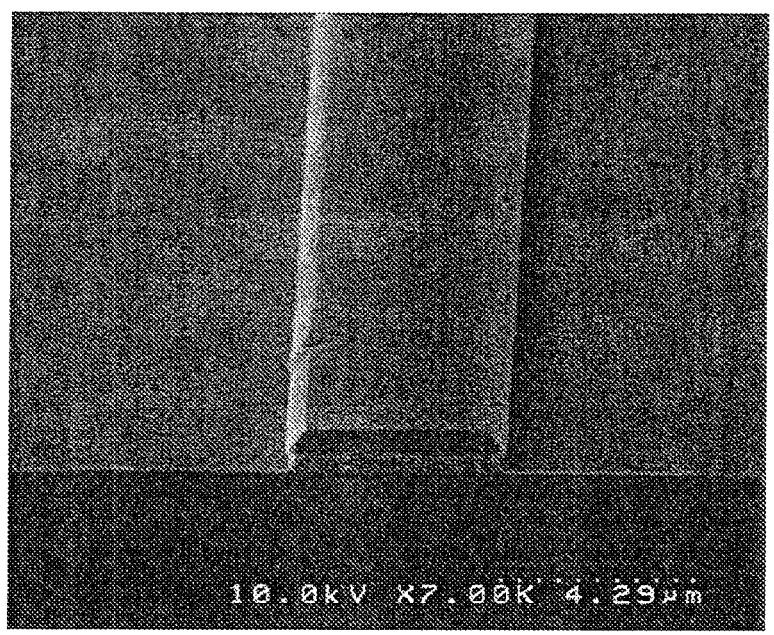

FIGS. 14A to 14C show an example of practically performing light exposure and development using a light exposure mask in which the relation between the sum of a line width L of a light shielding material and a space width S between the light shielding materials in a semi-transmissive portion, n, and m satisfies a conditional expression $(n/3) \times m \leq L+S \leq (3n/2) \times m$ when a resolution of a light exposure apparatus is represented by n and a projection magnification is represented by $1/m$ ($m \geq 1$). FIG. 14A shows a schematic cross-sectional view of the light exposure mask, and FIG. 14B shows a cross-sectional photograph of a resist pattern obtained by performing light exposure and development using this light exposure mask. The position of the light exposure mask in FIG. 14A and the position of the resist pattern in the cross-sectional photograph of FIG. 14B practically correspond to each other. A light exposure apparatus with a projection magnification of 1:1 and a resolution of 1.5 μm is used. In the light exposure mask of FIG. 14A, each line has a width of 0.5 μm and each space has a width of 1.0 μm, and the lines and the spaces satisfy the above relation. When light exposure and development are performed using this light exposure mask, a resist pattern with small and almost uniform thickness can be formed as shown in FIG. 14B.

This resist pattern is formed over two conductive layers in which a second conductive layer is stacked over a first conductive layer. Here, a TaN film is used as the first conductive layer, and a tungsten film is used as the second conductive layer.

Next, the second conductive layer and the first conductive layer are etched by dry etching. The dry etching is performed while ashing the resist pattern. As the etching gas, $CF_4$, $SF_6$, $Cl_2$, or/and $O_2$ is used. A dry etching apparatus using a high-density plasma source such as ECR (Electron Cyclotron Resonance) or ICP (Inductively Coupled Plasma) is used to improve an etching rate. Here, an example of using an ICP etching apparatus is described.

In this manner, a conductive stacked pattern including the first conductive layer and the second conductive layer is formed as shown in FIG. 14C. FIG. 14C shows a perspective observation photograph. By dry etching, the first conductive layer and the second conductive layer are etched and removed in a transmissive portion, that is, in a region where the resist pattern is not formed. In a light shielding portion, that is, in a region where the resist pattern is thick, the first conductive layer and the second conductive layer are left without being etched because the resist pattern serves as a mask. In a semi-transmissive portion, that is, in a region where the resist pattern is thin, the second conductive layer is etched and removed, while the first conductive layer is left without being etched. Thus, the etching exposes both side walls of the first conductive layer and exposes a region which is not overlapped with the second conductive layer.

By performing light exposure using the light exposure mask having a semi-transmissive portion and satisfying the above relation as described above, the amount of exposure light transmitted through the semi-transmissive portion on a surface to be exposed to light is almost homogenized in the semi-transmissive portion, and the resist pattern in the semi-transmissive portion can be formed with small and uniform thickness. A layer to be etched can be etched using a thin portion of the resist pattern. In the thin portion of the resist pattern, a layer to be etched can be formed thinner than a thick portion. In the thin portion of the resist pattern, a pattern of a layer to be etched can be formed in a shape different from that of the thick portion. By using this resist pattern, a gate electrode, other electrodes, a wire, and the like can be formed in a desired pattern with high accuracy. When a gate electrode including a thick first region and a second region thinner than the first region on a side of the first region is formed using this light exposure mask, a low-concentration impurity region overlapped with the gate electrode ($L_{ov}$ region) can be formed in a self-aligned manner on either or both sides of a channel formation region by using the gate electrode as a mask at the time of ion doping.

This embodiment mode can be freely combined with any of Embodiment Modes 1 to 8.

The present invention can reduce the number of photolithography steps (the number of masks), improve productivity of a semiconductor device, and reduce cost thereof by providing a photomask which can form a photoresist layer with small and uniform thickness in a semi-transmissive portion. According to the present invention, various circuits can be formed over the same substrate, and an LDD region having an optimum width can be formed in each circuit in a self-aligned manner. In addition, the width of the LDD region can be accurately controlled for each circuit. By optimizing the LDD region of a TFT in each circuit, improvement in reliability, reduction in power consumption, and high-speed driving can be achieved.

For example, a TFT having LDD regions with different widths on both sides of a channel formation region, a TFT having LDD regions with the same width on both sides of a channel formation region, a TFT without LDD regions, and the like can be formed over the same substrate without increasing the number of steps.

This application is based on Japanese Patent Application serial no. 2005-234791 filed in Japan Patent Office on Aug. 12, 2005, the contents of which are hereby incorporated by reference.

What is claimed is:

1. A method for manufacturing a semiconductor device, comprising the steps of:
    forming a first insulating film over a semiconductor layer;
    forming a conductive film over the first insulating film;
    forming a first resist pattern over the conductive film, the first resist pattern having a first region and a second region thinner than the first region on a side of the first region by using a light exposure mask including a semi-transmissive portion;
    forming a gate electrode having a third region and a fourth region thinner than the third region on a side of the third region by etching the conductive film with the use of the first resist pattern;
    injecting an impurity element into the semiconductor layer with the use of the gate electrode as a mask to form a source region and a drain region outside the gate electrode, and injecting the impurity element into the semiconductor layer through the second region of the gate electrode to form a first impurity region and a second impurity region in a region overlapped with the second region of the gate electrode;
    forming a second insulating film over the gate electrode;
    forming a second resist pattern over the second insulating film, the second resist pattern having a first opening and a second opening shallower than the first opening, by using the light exposure mask including the semi-transmissive portion; and
    forming a third opening and a fourth opening in the second insulating film by etching the second insulating film with the use of the second resist pattern, the first opening being overlapped with the third opening, the second opening being overlapped with the fourth opening, and a depth of the third opening being different from a depth of the fourth opening,
    wherein the first resist pattern and the second resist pattern are formed by using the light exposure mask in which a sum of a line width L of a light shielding material and a space width S between light shielding materials in the semi-transmissive portion satisfies a conditional expression $(n/3) \times m \leq L+S \leq (3n/2) \times m$ when a resolution of a light exposure apparatus is represented by n and a projection magnification is represented by $1/m$ ($m \geq 1$).

2. A method for manufacturing a semiconductor device, comprising the steps of:
    forming a first insulating film over a semiconductor layer;
    forming a conductive film over the first insulating film;
    forming a first resist pattern over the conductive film, the first resist pattern having a first region and a second region thinner than the first region on a side of the first region by using a light exposure mask including a semi-transmissive portion;
    forming a gate electrode having a third region and a fourth region thinner than the third region on a side of the third region by etching the conductive film with the use of the first resist pattern;
    injecting an impurity element into the semiconductor layer with the use of the gate electrode as a mask to form a source region and a drain region outside the gate electrode, and injecting the impurity element into the semiconductor layer through the second region of the gate electrode to form a first impurity region and a second impurity region in a region overlapped with the second region of the gate electrode;

forming a second insulating film over the gate electrode;

forming a second resist pattern over the second insulating film, the second resist pattern having a first opening and a second opening shallower than the first opening by using the light exposure mask including the semi-transmissive portion; and forming a third opening and a fourth opening in the second insulating film by etching the second insulating film with the use of the second resist pattern, the first opening being overlapped with the third opening, the second opening being overlapped with the fourth opening, and a depth of the third opening being different from a depth of the fourth opening, wherein the first resist pattern and the second resist pattern are formed by using the light exposure mask in which a sum of a line width L of a light shielding material and a space width S between light shielding materials in the semi-transmissive portion satisfies a conditional expression $(2n/3) \times m \leq L+S \leq (6n/5) \times m$ when a resolution of a light exposure apparatus is represented by n and a projection magnification is represented by $1/m$ ($m \geq 1$).

3. A method for manufacturing a semiconductor device according to claim 1, wherein a relation between n, m, and L satisfies $L<(2n/3) \times m$.

4. A method for manufacturing a semiconductor device according to claim 2, wherein a relation between n, m, and L satisfies $L<(2n/3) \times m$.

5. A method for manufacturing a semiconductor device according to claim 1, wherein each of the first and second impurity regions contains an impurity element imparting n-type or p-type conductivity at a concentration lower than that of each of the source region and the drain region.

6. A method for manufacturing a semiconductor device according to claim 2, wherein each of the first and second impurity regions contains an impurity element imparting n-type or p-type conductivity at a concentration lower than that of each of the source region and the drain region.

7. A method for manufacturing a semiconductor device, comprising the steps of:

forming a first insulating film over a semiconductor layer;

forming a conductive film over the first insulating film;

forming a first resist pattern over the conductive film, the first resist pattern having a first region and a second region thinner than the first region on a side of the first region by using a light exposure mask including a semi-transmissive portion;

forming a gate electrode having a third region and a fourth region thinner than the third region on a side of the third region by etching the conductive film with the use of the first resist pattern;

injecting an impurity element into the semiconductor layer with the use of the gate electrode as a mask to form a source region and a drain region outside the gate electrode, and injecting the impurity element into the semiconductor layer through the second region of the gate electrode to form a first impurity region and a second impurity region in a region overlapped with the second region of the gate electrode;

forming a second insulating film over the gate electrode;

forming a second resist pattern over the second insulating film, the second resist pattern having a first opening and a second opening shallower than the first opening by using the light exposure mask including the semi-transmissive portion;

forming a third opening and a fourth opening in the second insulating film by etching the second insulating film with the use of the second resist pattern, the first opening being overlapped with the third opening, the second opening being overlapped with the fourth opening, and a depth of the third opening being different from a depth of the fourth opening; and forming a first wiring over the third opening and a second wiring over the fourth opening, wherein the first resist pattern and the second resist pattern are formed by using the light exposure mask in which a sum of a line width L of a light shielding material and a space width S between light shielding materials in the semi-transmissive portion satisfies a conditional expression $(n/3) \times m \leq L+S \leq (3n/2) \times m$ when a resolution of a light exposure apparatus is represented by n and a projection magnification is represented by $1/m$ ($m \geq 1$).

8. A method for manufacturing a semiconductor device, comprising the steps of:

forming a first insulating film over a semiconductor layer;

forming a conductive film over the first insulating film;

forming a first resist pattern over the conductive film, the first resist pattern having a first region and a second region thinner than the first region on a side of the first region by using a light exposure mask including a semi-transmissive portion;

forming a gate electrode having a third region and a fourth region thinner than the third region on a side of the third region by etching the conductive film with the use of the first resist pattern;

injecting an impurity element into the semiconductor layer with the use of the gate electrode as a mask to form a source region and a drain region outside the gate electrode, and injecting the impurity element into the semiconductor layer through the second region of the gate electrode to form a first impurity region and a second impurity region in a region overlapped with the second region of the gate electrode;

forming a second insulating film over the gate electrode;

forming a second resist pattern over the second insulating film, the second resist pattern having a first opening and a second opening shallower than the first opening by using the light exposure mask including the semi-transmissive portion;

forming a third opening and a fourth opening in the second insulating film by etching the second insulating film with the use of the second resist pattern, the first opening being overlapped with the third opening, the second opening being overlapped with the fourth opening, and a depth of the third opening being different from a depth of the fourth opening; and forming a first wiring over the third opening and a second wiring over the fourth opening, wherein the first resist pattern and the second resist pattern are formed by using the light exposure mask in which a sum of a line width L of a light shielding material and a space width S between light shielding materials in the semi-transmissive portion satisfies a conditional expression $(2n/3) \times m \leq L+S \leq (6n/5) \times m$ when a resolution of a light exposure apparatus is represented by n and a projection magnification is represented by $1/m$ ($m \geq 1$).

9. A method for manufacturing a semiconductor device according to claim 7, wherein a relation between n, m, and L satisfies $L<(2n/3) \times m$.

10. A method for manufacturing a semiconductor device according to claim 8, wherein a relation between n, m, and L satisfies L<(2n/3)×m.

11. A method for manufacturing a semiconductor device according to claim 7, wherein each of the first and second impurity regions contains an impurity element imparting n-type or p-type conductivity at a concentration lower than that of each of the source region and the drain region.

12. A method for manufacturing a semiconductor device according to claim 8, wherein each of the first and second impurity regions contains an impurity element imparting n-type or p-type conductivity at a concentration lower than that of each of the source region and the drain region.

* * * * *